(12) United States Patent
Rotschild et al.

(10) Patent No.: US 10,727,365 B2
(45) Date of Patent: Jul. 28, 2020

(54) ENERGY CONVERSION SYSTEM

(71) Applicant: Technion Research & Development Foundation Limited, Haifa (IL)

(72) Inventors: Carmel Rotschild, Ganei-Tikva (IL); Assaf Manor, Haifa (IL)

(73) Assignee: Technion Research & Development Foundation Limited, Haifa (IL)

( * ) Notice: Subject to any disclaimer, the term of this patent is extended or adjusted under 35 U.S.C. 154(b) by 0 days.

(21) Appl. No.: 14/418,164

(22) PCT Filed: Jul. 24, 2013

(86) PCT No.: PCT/IL2013/050633
§ 371 (c)(1),
(2) Date: Jan. 29, 2015

(87) PCT Pub. No.: WO2014/020595
PCT Pub. Date: Feb. 6, 2014

(65) Prior Publication Data
US 2015/0171251 A1    Jun. 18, 2015

Related U.S. Application Data

(60) Provisional application No. 61/811,741, filed on Apr. 14, 2013, provisional application No. 61/677,070, filed on Jul. 30, 2012.

(51) Int. Cl.
*H01L 31/055* (2014.01)
*H01S 3/094* (2006.01)
(Continued)

(52) U.S. Cl.
CPC ...... *H01L 31/055* (2013.01); *H01L 31/02168* (2013.01); *H01L 31/0547* (2014.12);
(Continued)

(58) Field of Classification Search
CPC .. H02S 10/30; H01L 31/055; H01L 31/02322
See application file for complete search history.

(56) References Cited

U.S. PATENT DOCUMENTS 4,776,895 A   10/1988  Goldstein
6,128,325 A   10/2000  Goldstein et al.
(Continued)

FOREIGN PATENT DOCUMENTS

CN    101785114    7/2010
CN    101790800    7/2010
(Continued)

OTHER PUBLICATIONS

Ekins-Daukes et al. "Photovoltaic efficiency enhancement through thermal up-conversion" 3rd World Conference on Photovoltaic Energy Conversion May 11-18, 2003 Osaka, Japan (Year: 2004).*
(Continued)

*Primary Examiner* — Magali P Slawski

(57) ABSTRACT

A method of emitting photons at a desired wavelength, including: providing a material having a first region of high absorption of radiation at a first set of wavelength of radiation, contiguous with a second region of low absorption of radiation at a shorter set of wavelengths, and a third region of high emission at a further shorter set of wavelengths; applying energy to the material at the first region, such that most of an effective black body radiation of said material at a temperature of the material would fall within the second region and be configured to transfer energy to said third region and not overlap with the first region; and emitting energy from the material at the third region, powered by said applying energy.

31 Claims, 15 Drawing Sheets
(11 of 15 Drawing Sheet(s) Filed in Color)

(51) Int. Cl.
      *H01S 3/16*            (2006.01)
      *H01S 3/06*            (2006.01)
      *H01L 31/054*          (2014.01)
      *H01L 31/0216*        (2014.01)
      *H01S 3/091*          (2006.01)
      *H01S 3/04*            (2006.01)
      *H01S 3/0943*         (2006.01)
      *H01S 3/17*            (2006.01)
      *H01S 3/09*            (2006.01)
      *H01S 3/0915*         (2006.01)

(52) U.S. Cl.
     CPC ............ *H01S 3/0627* (2013.01); *H01S 3/091* (2013.01); *H01S 3/09403* (2013.01); *H01S 3/169* (2013.01); *H01S 3/0408* (2013.01); *H01S 3/09* (2013.01); *H01S 3/0915* (2013.01); *H01S 3/0943* (2013.01); *H01S 3/1618* (2013.01); *H01S 3/176* (2013.01); *Y02E 10/52* (2013.01)

(56) References Cited

U.S. PATENT DOCUMENTS

| | | | |
|---|---|---|---|
| 2003/0053776 | A1* | 3/2003 | Dejneka .............. H01S 3/06754 385/123 |
| 2009/0056791 | A1* | 3/2009 | Pfenninger ........... H01L 31/055 136/247 |
| 2009/0095341 | A1 | 4/2009 | Pfenninger et al. |
| 2009/0120494 | A1* | 5/2009 | Moon ............... H01L 31/02246 136/256 |
| 2009/0207484 | A1* | 8/2009 | Shia .................... H01S 3/06754 359/341.3 |
| 2009/0251672 | A1* | 10/2009 | Nagasaka ........... G03F 7/70341 355/30 |
| 2010/0157418 | A1* | 6/2010 | Dong ................. G02B 6/02009 359/341.3 |
| 2010/0193011 | A1 | 8/2010 | Mapel et al. |
| 2010/0224248 | A1 | 9/2010 | Kenney et al. |
| 2010/0319749 | A1* | 12/2010 | Greiff ..................... H02S 10/30 136/213 |
| 2011/0253197 | A1 | 10/2011 | Mapel et al. |
| 2012/0031466 | A1* | 2/2012 | Bruer .................... H01L 31/055 136/246 |
| 2012/0287597 | A1* | 11/2012 | Wu ......................... H02S 50/10 362/2 |
| 2013/0220416 | A1* | 8/2013 | Yui .................... H01L 31/02322 136/257 |
| 2014/0185282 | A1 | 7/2014 | Hsu et al. |

FOREIGN PATENT DOCUMENTS

| | | |
|---|---|---|
| CN | 102265410 | 11/2011 |
| CN | 102446999 | 5/2012 |
| CN | 102460725 | 5/2012 |
| CN | 103059834 | 4/2013 |
| CN | 101794834 B * | 6/2013 |
| WO | WO 2009/002943 | 12/2008 |
| WO | WO 2013/144751 | 10/2013 |
| WO | WO 2014/020595 | 2/2014 |
| WO | WO 2015/002995 | 1/2015 |
| WO | WO 2019/102465 A9 | 5/2019 |

OTHER PUBLICATIONS

Guazzoni "High-Temperature Spectral Emittance of Oxides of Erbium, Samarium, Neodymium and Ytterbium" Applied Spectroscopy vol. 26, No. 1, 1972 pp. 60-65 (Year: 1972).*
Machine translation of CN-101794834-B (Year: 2018).*
Translation of Notification of Office Action dated Dec. 29, 2016 From the State Intellectual Property Office of the People's Republic of China Re. Application No. 201380051151.3. (8 Pages).
Kirchhoff "On the Relation Between the Radiating and Absorbing Powers of Different Bodies for Light and Heat", The London, Edingburgh, and Dublin Philosophical Magazine and Journal of Science, 4th Series, 20: 1-21, Jul.-Dec. 1860.
Kitamura et al. "Optical Constants of Silica Glass From Extreme Ultraviolet to Far Infrared at Near Room Temperature", Applied Optics, 46(33): 8118-8133, Nov. 20, 2007.
Kittel et al. "Heat and Work", Thermal Physics, 2nd Ed., Chap.8: 246-247, 1980.
Landsberg et al. "Thermodynamic Energy Conversion Efficiencies", Journal of Applied Physics, 51(7): R1-R20, Jul. 1980.
Lucy "Infrared to Visible Parametric Upconversion", Applied Optics, 11(6): 1329-1336, Jun. 1972.
Manor et al. "An Entropy Driven Laser", Department of Mechanical Engineering, Technion, Haifa, Israel, 5 P.
Mashaal et al. "First Direct Measurement of the Spatial Coherence of Sunlight", Optics Letters, 37(17): 3516-3518, Sep. 1, 2012.
McLachlan et al. "Temperature Dependence of the Extinction Coefficient of Fused Silica for CO2 Laser Wavelengths", Applied Optics, 26(9): 1728-1731, May 1, 1987.
Mulet et al. "Enhanced Radiative Heat Transfer at Nanometric Distances", Microscale Thermophysical Engineering, 6(3): 209-222, 2002.
Oxborrow "Traceable 2D Finite-Element Simulation of the Whispering-Gallery Modes of Axisymmetric Electromagnetic Resonators", IEEE Transactions on Microwave Theory and Techniques, 55: 1209-1218, 2007.
Pendry "Radiative Exchange of Heat Between Nanostructures", Journal of Physics: Condensed Matter, 11: 6621-6633, 1999.
Philipp "Silicon Dioxide (SiO2) (Glass)", Handbook of Optical Constants of Solids, p. 749-763, 1985.
Planck et al. The Theory of Heat Radiation, 289 P., 1914.
Purcell "Spontaneous Emission Probabilities at Radio Frequencies", Proceedings of the American Physical Society, Minutes of the Spring Meeting, Cambridge, MA, USA, Apr. 25-27, 1946, Physical Review 69(11-12): 681, Apr. 1946.
Ries et al. "Chemical Potential and Temperature of Light", Journal of Photochemistry and Photobiology A: Chemistry, 59: 11-18, 1991.
Rytov "Certain Results From the Classical Theory of Thermal Radiation", Theory of Electric Fluctuations and Thermal Radiation, Section 2: 20-30, 1959.
Notification of Office Action and Search Report dated Dec. 29, 2016 From the State Intellectual Property Office of the People's Republic of China Re. Application No. 201380051151.3. (9 Pages).
Communication Relating to the Results of the Partial International Search dated Nov. 6, 2013 From the International Searching Authority Re. Application No. PCT/IL2013/050633.
International Preliminary Report on Patentability dated Feb. 12, 2015 From the International Bureau of WIPO Re. Application No. PCT/IL2013/050633.
International Search Report and the Written Opinion dated Feb. 10, 2014 From the International Searching Authority Re. Application No. PCT/IL2013/050633.
Auzel "Upconversion and Anti-Stokes Processes With F and D Lons in Solids", Chemical Reviews, 104(1): 139-174, Nov. 18, 2003.
Baluschev et al. "Up-Conversion Fluorescence: Noncoherent Excitation by Sunlight", Physical Review Letters, 97: 143903-1-143903-3, Oct. 6, 2006.
Barber et al. "Observation of Synchronous Picosecond Sonoluminescence", Nature, 352(6333): 318-320, Jul. 25, 1991.
Bogani et al. "Coherent Hyper-Raman Scattering From Hot Polaritons in Amorphous Quartz", Solide State Communications, 67(12): 1123-1126, 1988.
Cai et al. "Fiber-Coupled Microsphere Laser", Optics Letters, 25(19): 1430-1432, Oct. 1, 2000.
Carman et al. "Observation of Harmonics in the Visible and Ultraviolet Created in CO2-Laser-Produced Plasmas", Physical Review A, 24(5): 2649-2664, Nov. 1981.
Gallego Lluesma et al. "Very High Non-Thermal Equilibrium Population of Optical Phonons in GaAs", Solid State Communications, 14: 1195-1197, 1974.

(56) References Cited

OTHER PUBLICATIONS

Guazzoni "High-Temperature Spectral Emittance of Oxides of Erbium, Samarium, Neodymium and Ytterbium", Applied Spectroscopy, 26(1): 60-65, 1972.
Henke et al. "Saturation Effects in the Upconversion Efficiency of Er-Doped Fluorozirconate Glasses", Journal of Physics: Condensed Matter, 22: 155107-1-155107-6, 2010.
Höfler et al. "Selective Emitters for Thermophotovoltaic Solar Energy Conversion", Solar Cells, 10: 257-271, 1983.
Howell et al. "Evanescent and Surface Waves", Thermal Radiation Heat Transfer, Near-Field Thermal Radiation, 5th Ed. Chap.16.3: 794-801, 2010.
Khurgin "Surface Plasmon Assisted Laser Cooling of Solids", 2007 Conference on Lasers and Electro-Optics, CLEO '07, Baltimore, MD, USA, XP031203418, p. 1-2, May 1, 2007. p. 1-2, Figs.1-3.
Seletskiy et al. "Laser Cooling of Solids to Cryogenic Temperatures", Nature Photonics, 4: 161-164, Mar. 2010.
Shalav et al. "Application of NaYF4:Er3+ Up-Conversion Phosphors for Enhanced Near-Infrared Silicon Solar Cell Response", Applied Physics Letters, 86: 013505-1-013505-3, 2005.
Shen et al. "Surface Phonon Polaritons Mediated Energy Transfer Between Nanoscale Gaps", Nano Letters, 9(8): 2909-2913, 2009.
Smestad et al. "The Thermodynamic Limits of Light Concentrators", Solar Energy Materials, 21: 99-111, 1990.
Torsello et al. "The Origin of Highly Efficient Selective Emission in Rare-Earth Oxides for Thermophotovoltaic Applications", Nature Materials, 3: 632-637, Sep. 2004.
Vahala "Optical Microcavities", Nature, 424: 839-846, Aug. 14, 2003.
Volokitin et al. "Near-Field Radiative Heat Transfer and Noncontact Friction", Reviews of Modern Physics, 79: 1291-1329, Oct.-Dec. 2007.
Warner "Parametric Up-Conversion From the Infra-Red", Opto-Electronics, 3: 37-48, 1971.
Würfel "The Chemical Potential of Radiation", Journal of Physics C: Solid State Physics, 15: 3967-3985, 1982.
Yabe et al. "Demonstrated Fossil-Fuel-Free Energy Cycle Using Magnesium and Laser", Applied Physics Letters, 89: 261107-1-261107-3, 2006.
Yariv "Second-Harmonic Generation and Parametric Oscillation", Optical Electronics in Modern Communications, 5th Ed., Chap.8: 273-287, 1997.
Notification of Office Action and Search Report dated Sep. 4, 2017 From the State Intellectual Property Office of the People's Republic of China Re. Application No. 201380051151.3. (12 Pages).
Translation of Notification of Office Action and Search Report dated Sep. 4, 2017 From the State Intellectual Property Office of the People's Republic of China Re. Application No. 201380051151.3. (10 Pages).
Tian "Introductions to Advanced Materials", Harbin Institute of Technology Press, p. 274, Jan. 2005.
Yi "China Materials Engineering Canon", Composite Material Engineering, Chemical Industry Press, 10: 998-999, Aug. 2005.
Hsu et al. "Transparent Displays Enabled by Resonant Nanoparticle Scattering", Nature Communications, 5(3152): 1-6, Published Online Jan. 21, 2014.
Manor et al. "Thermally Enhanced Photoluminescence for Heat Harvesting in Photovoltaics", Nature Communications, 7(13167): 1-8, Published Online Oct. 20, 2016.
Notification of Office Action dated Mar. 28, 2019 From the State Intellectual Property Office of the People's Republic of China Re. Application No. 201380051151.3. (6 Pages).
Translation dated Apr. 10, 2019 of Notification of Office Action dated Mar. 28, 2019 From the State Intellectual Property Office of the People's Republic of China Re. Application No. 201380051151.3. (5 Pages).
International Search Report and the Written Opinion dated Mar. 5, 2019 From the International Searching Authority Re. Application No. PCT/IL2018/051265. (18 Pages).

Aarts et al. "Downconversion for Solar Cells in YF3:Pr3+, Yb3+", Spectroscopy Letters, 43(5): 373-381, Published Online Jul. 30, 2010.
Agrafiotis et al. "A Review on Solar Thermal Syngas Production Via Redox Pair-Based Water/Carbon Dioxide Splitting Thermochemical Cycles", Renewable and Sustainable Energy Reviews, 42: 254-285, Available Online Oct. 28, 2014.
Benayas et al. "Luminescence Quantum Efficiency of Nd3+:Y3Al5O12 Garnet Laser Ceramics Determined by Pump-Induced Line Broadening", IEEE Journal of Quantum Electronics, 46(12): 1870-1876, Published Online Nov. 24, 2010.
Boulon "Why so Deep Research on Yb3+-Doped Optical Inorganic Materials?", Journal of Alloys and Compounds, 451(1-2): 1-11, Available Online Apr. 19, 2007.
Braun et al. "Photovoltaic Performance Enhancement by External Recycling of Photon Emission", Energy & Environmental Science, 6(5): 1499-1503, Published Online Apr. 2, 2013.
De Mello et al. "An Improved Experimental Determination of External Photoluminescence Quantum Efficiency", Advanced Materials, 9(3): 230-232, Mar. 1997.
Duquette et al. "Comparative Economic Analysis of Concentrating Solar Technologies", Journal of Solar Energy Engineering, 135(2): 024504-1-024501-4, Published Online Nov. 21, 2012.
Essig et al. "Raising the One-Sun Conversion Efficiency of III-V/Si Solar Cells to 32.8% for Two Junctions and 35.9% for Three Junctions", Nature Energy, 2(Art.17144): 1-9, Published Online Aug. 25, 2017.
Fuijoka et al. "Parameter Mapping Survey on Optimized Sensitizing Effect of Ce/Cr/Nd:YAG Material for Solar-Pumped Solid-State Lasers", Journal of Luminescence, 143: 10-13, Available Online Apr. 30, 2013.
Fujioka et al. "Luminescence Properties of Highly Cr Co-Doped Nd:YAG Powder Produced by Sol-Gel Method", Journal of Luminescence, 130(3): 455-459, Available Online Oct. 29, 2009.
Ghosh et al. "Quantum Cutting Induced Multifold Enhanced Emission for Cr3+—Yb3+—Nd3+Doped Zinc Fluoroboro Silicate Glass—Role of Host Material", Journal of Applied Physics, 120(23): 233104-1-233104-10, Dec. 21, 2016.
Hirst et al. "Fundamental Losses in Solar Cells", Progress in Photovoltaics: Research and Applications, 19(3): 286-293, Published Online Aug. 26, 2010.
Houaijia et al. "Solar Hydrogen by High-Temperature Electrolysis: Flowsheeting and Experimental Analysis of A Tube-Type Receiver Concept for Superheated Steam Production", Energy Procedia, 49: 1960-1969, Jan. 2014.
Kuravi et al. "Thermal Energy Storage Technologies and Systems for Concentrating Solar Power Plants", Progress in Energy and Combustion Science, 39(4): 285-319, Available Online Mar. 22, 2013.
Li et al. "Efficient Near-Infrared Downconversion and Energy Transfer Mechanism of Ce3+/Yb3+ Codoped Calcium Scandate Phosphor", Inorganic Chemistry, 54(10): 4806-4810, Published Online May 6, 2015.
Li et al. "Fabrication, Microstructure and Properties of Highly Transparent Nd:YAG Laser Ceramics", Optical Materials, 31: 6-17, Available Online Feb. 20, 2008.
Liang et al. "Side-Pumped Continuous-Wave Cr:Nd:YAG Ceramic Solar Laser", Applied Physics B: Lasers and Optics, 111(2): 305-3``, Published Online Jan. 30, 2013.
Liu et al. "Review on Concentrating Solar Power Plants and New Developments in High Temperature Thermal Energy Storage Technologies", Renewable and Sustainable Energy Reviews, 53: 1411-1432, Available Online Nov. 10, 2015.
Manor et al. "Conservation of Photon Rate in Endothermic Photoluminescence and Its Transition to Thermal Emission", Optica, 2(6): 585-588, Published Online Jun. 19, 2015.
Mehos et al. "Concentrating Solar Power Gen3 Demonstration Roadmap", National Renewable Energy Laboratory, NREL/TP-5500-67464, Technical Report, p. 1-127, Jan. 2017.

(56) References Cited

OTHER PUBLICATIONS

Pidaparthi et al. "Optical Performance Considerations for Analysis and Simulation of Power Tower Plants", SolarPACES 2016, AIP Conference Proceedings, 1850(1): 160021-1-160021-9, Published Online Jun. 27, 2017.

Rabl "Optical and Thermal Properties of Compound Parabolic Concentrators", Solar Energy, 18(6): 497-511, Jan. 1976.

Renno "Optimization of A Concentrating Photovoltaic Thermal (CPV/T) System Used for A Domestic Application", Applied Thermal Engineering, 67(1-2): 396-408, Available Online Mar. 27, 2014.

Reusswig et al. "A Path to Practical Solar Pumped Lasers Via Radiative Energy Transfer", Scientific Reports, 5(14758): 1-6, Published Online Oct. 5, 2015.

Saiki et al. "Increase in Effective Fluorescence Lifetime by Cross-Relaxation Effect Depending on Temperature of Nd/Cr:YAG Ceramic Using White-Light Pump Source", Optics and Photonics Letters, 6(1): 135003-1-1350003-15, Published Online Apr. 10, 2013.

Sargent & Lundy LLC Consulting Group "Assessment of Parabolic Trough and Power Solar Technology Cost and Performance Forecasts", National Renewable Energy Laboratory, NREL/SR-550-34440, Subcontractor Report, p. 1-344, Oct. 2003.

Sawala et al. "Spectral Downshifting From Blue to Near Infer Red Region in Ce3+—Nd3+—Co-Doped YAG Phosphor", Infrared Physics & Technology, 77: 480-484, Available Online Jul. 5, 2016.

Shockley et al. "Detailed Balance Limit of Efficiency of P—N Junction Solar Cells", Journal of Applied Physics, 32(3): 510-519, Mar. 1961.

Tai et al. "Near-Infrared Quantum Cutting of Ce3+—Nd3+ Co-Doped Y3Al5O12 Crystal for Crystalline Silicon Solar Cells", Journal of Photochemistry and Photobiology A: Chemistry, 303-304: 80-85, Available Online Feb. 17, 2015.

Thompson et al. "Solar-Pumped Nd:Cr:GSGG Parallel Array Laser", Optical Engineering, 31(12): 2644-2646, Dec. 1992.

Varshni "Temperature Dependence of the Energy Gap in Semiconductors", Physica, 34(1): 149-154, 1967.

Yu et al. "Selecting Tandem Partners for Silicon Solar Cells", Nature Energy, 1(Art.16137): 1-4, Published Online Sep. 26, 2016.

Zeitouny et al. "On the Potential of Solar Cells to Efficiently Operate at High Temperature", Proceedings of the 13th International Conference on Concentrator Photovoltaic Systems, CPV-13, AIP Conference Proceedings, 1881: 080011-1-080011-6, Published Online Sep. 6, 2017.

Communication Pursuant to Rule 164(2)(b) and Article 94(3) EPC dated May 31, 2017 From the European Patent Office Re. Application No. 13752683.6. (10 Pages).

Summons to Attend Oral Proceedings Pursuant to Rule 115(1) EPC dated Dec. 20, 2019 From the European Patent Office Re. Application No. 13752683.6. (8 Pages).

Communication Under Rule 164(2)(a) EPC dated Mar. 2, 2017 From the European Patent Office Re. Application No. 13752683.6. (4 Pages).

Translation Dated Aug. 15, 2018 of Notification of Office Action and Search Report dated Jul. 9, 2018 From the State Intellectual Property Office of the People's Republic of China Re. Application No. 201380051151.3. (9 Pages).

Notification of Office Action and Search Report dated Jul. 9, 2018 From the State Intellectual Property Office of the People's Republic of China Re. Application No. 201380051151.3. (10 Pages).

\* cited by examiner

The blue line is the emission due to low emissivity window and entropy driven pump

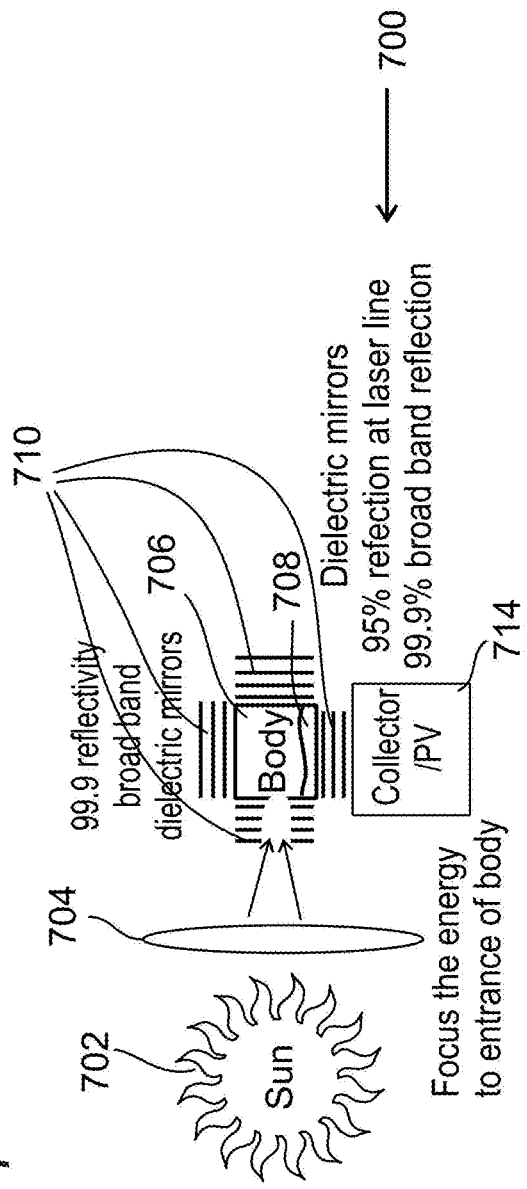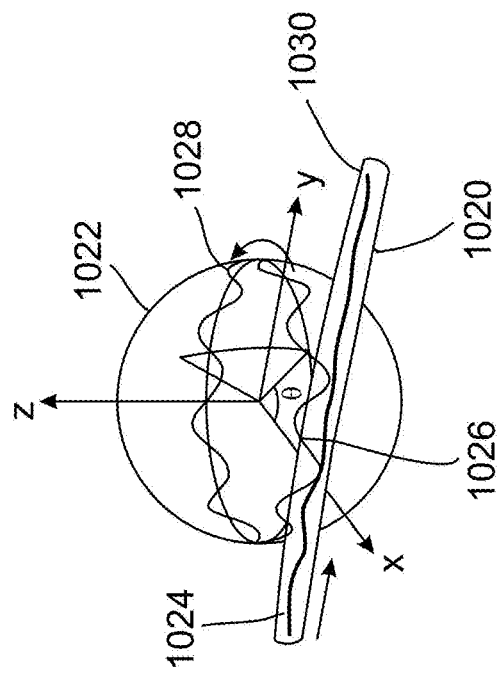

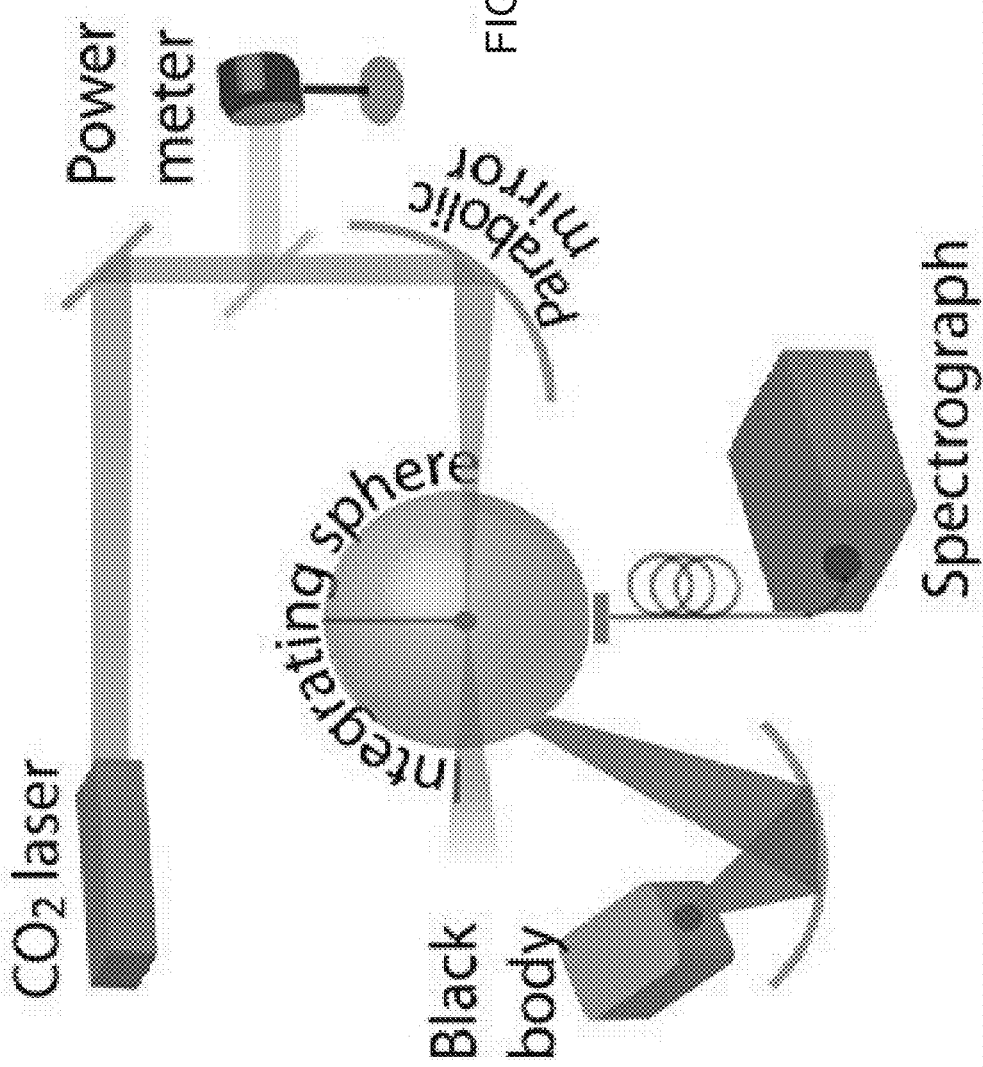
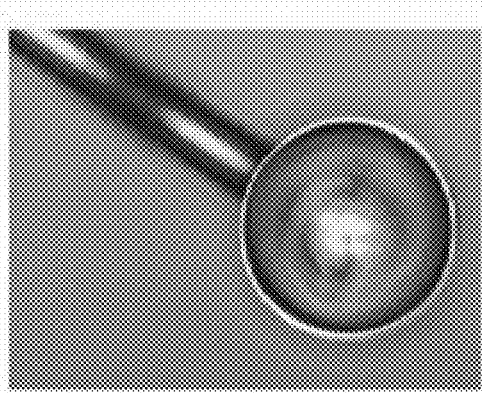
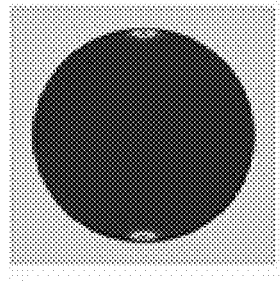
FIG. 13A
FIG. 13B
FIG. 13C

ENERGY CONVERSION SYSTEM

RELATED APPLICATIONS

This application is a National Phase of PCT Patent Application No. PCT/IL2013/050633 having International filing date of Jul. 24, 2013, which claims the benefit of priority under 35 USC § 119(e) of U.S. Provisional Patent Application Nos. 61/811,741, filed on Apr. 14, 2013 and 61/677,070, filed on Jul. 30, 2012. The contents of the above applications are all incorporated by reference as if fully set forth herein in their entirety.

FIELD AND BACKGROUND OF THE INVENTION

The present invention, in some embodiments thereof, relates to an energy conversion system and, more particularly, but not exclusively, to a conversion system which upconverts energy from longer wavelengths to shorter wavelength.

Typical materials, when heated emit energy at wavelengths distributed in a manner dependent on their emissivity. An ideal material will emit radiation, when heated, at wavelengths corresponding to those of a black body. This is known as black body radiation.

Typical energy conversion systems convert energy from short wavelengths to long waves, for example, in fluorescence or in laser radiation by optical stimulation.

Since the discovery of laser action decades ago, it has been realized in diverse systems and mechanisms. These include optically, electrically, chemically, and thermally pumped lasers. A general principle to all known lasers is the need for high energy pump excitation, above the lasing photon energy. In the thermodynamic formalism, the above principle describes work that can be obtained by the excitation's chemical potential.

Apparently, all existing lasers use pump excitation quanta (electron, photon, etc.), with energy above the energy-gap of the lasing media. This is because lasing necessitates population inversion between the higher and the lower energy-gap states, which is gained by the preferred energy transfer from the pump to the higher energy state. This, by Fermi's golden role, occurs if the pump excitations have energy above the band-gap.

To understand the broad picture of pump mechanism, pump action may be related to work performed by a thermodynamic system. Here each photon's potential energy is defined by its chemical potential, $\mu$. In this view, the conventional absorption of a pump photon followed by photoluminescence of a red shifted photon, while releasing heat to the environment is an "optical heat pump" action. The work of generating a single emitted photon is achieved by reducing the chemical potential of a single pump photon, accompanied by the extraction of heat.

In the complete thermodynamic perspective, the amount of work a system can produce is limited by its Gibbs free energy, G:

$$G = [P \cdot V + T \cdot S + \Sigma \mu \cdot N]$$

where P is the pressure, V is volume, T is temperature, S is the entropy, $\mu$ is the chemical potential and N is the number of particles (photons). In most optical systems P and V are constant, so change in [P·V] can be excluded. An exceptional phenomenon is sonoluminescence, where UV emission is generated as sound is converted to light through a drastic change in PV. The chemical potential term, $\Sigma \mu \cdot N$, relates to all known laser pump mechanisms and also to energy conversion in nonlinear processes such as second harmonic generation, where the number of photons compensates for the photon's low individual chemical potential. Using such conventional mechanisms to generate ten-fold parametric up-conversion results in a negligible efficiency.

Additional background art includes:

(1) A. Yariv, Optical Electronics in Modern Communications (Oxford University Press, USA, ed. 5, 1997, pages 273-287;

(2) J. Warner, Parametric up-conversion from the infra-red, Opto-electronics 3, 37-48 (1971);

(3) R. F. Lucy, Infrared to Visible Parametric Upconversion, Appl. Opt. 11, 1329-1336 (1972);

(4) B. Henke et al., Saturation effects in the upconversion efficiency of Er-doped fluorozirconate glasses, Journal of Physics: Condensed Matter 22, 155107 (2010);

(5) A. Shalav, B. S. Richards, T. Trupke, K. W. Krämer, H. U. Güdel, Application of $NaYF_4:Er^3+$ up-converting phosphors for enhanced near-infrared silicon solar cell response, Applied Physics Letters 86, 013505 (2005);

(6) S. Baluschev et al., Up-Conversion Fluorescence: Noncoherent Excitation by Sunlight, Phys. Rev. Lett. 97, 143903 (2006):

(7) F. Auzel, Upconversion and Anti-Stokes Processes with f and d Ions in Solids, Chem. Rev. 104, 139-174 (2003);

(8) R. L. Carman, C. K. Rhodes, R. F. Benjamin, Observation of harmonics in the visible and ultraviolet created in CO2-laser-produced plasmas, Phys. Rev. A 24, 2649-2663 (1981);

(9) P. Wurfel, The chemical potential of radiation, Journal of Physics C: Solid State Physics 15, 3967-3985 (1982);

(10) H. Ries, A. J. McEvoy, Chemical potential and temperature of light, Journal of Photochemistry and Photobiology A: Chemistry 59, 11-18 (1991);

(11) G. Smestad, H. Ries, R. Winston, E. Yablonovitch, The thermodynamic limits of light concentrators, Solar Energy Materials 21, 99-111 (1990);

(12) C. Kittel, H. Kroemer, Thermal Physics (W. H. Freeman, Second Edition, 1980), pages 246-247;

(13) B. P. Barber, S. J. Putterman, Observation of synchronous picosecond sonoluminescence, Nature 352, 318-320 (1991);

(14) P. T. Landsberg, G. Tonge, Thermodynamic energy conversion efficiencies, Applied Physics Reviews 1980, 1-1 (1980);

(15) E. Gallego Lluesma, G. Mendes, C. A. Arguello, R. C. C. Leite, Very high non-thermal equilibrium population of optical phonons in GaAs, Solid State Communications 14, 1195-1197 (1974);

(16) S. M. Rytov, Theory of Electric Fluctuations and Thermal Radiation (PN, 1959, pages 20-30;

(17) J. P. Mulet, K. Joulain, R. Carminati, J.-J. Greffet, Enhanced Radiative Heat Transfer at Nanometric Distances, Microscale Thermophysical Engineering 6, 209-222 (2002);

(18) A. I. Volokitin, B. N. J. Persson, Near-field radiative heat transfer and noncontact friction, Rev. Mod. Phys. 79, 1291-1329 (2007);

(19) J. B. Pendry, Radiative exchange of heat between nanostructures, Journal of Physics: Condensed Matter 11, 6621-6633 (1999);

(20) M. Planck, The Theory of Heat Radiation. Dover Publications, 1959;

(21) G. Kirchhoff, Ueber das Verhältniss zwischen dem Emissionsvermögen und dem Absorptionsvermogen der Körper für Wärme und Licht, Annalen der Physik 185, 275-301 (1860);

(22) E. D. Palik, Handbook of Optical Constants of Solids E. D. Palik, Ed. Academic Press, ed. 1, 1997;

(23) S. Shen, A. Narayanaswamy, G. Chen, Surface Phonon Polaritons Mediated Energy Transfer between Nanoscale Gaps, Nano Lett. 9, 2909-2913 (2009):

(24) A. D. McLachlan, F. P. Meyer, Temperature dependence of the extinction coefficient of fused silica for CO2 laser wavelengths, Appl. Opt. 26, 1728-1731 (1987);

(25) R. Kitamura, L. Pilon, M. Jonasz, Optical constants of silica glass from extreme ultraviolet to far infrared at near room temperature, Appl. Opt. 46, 8118-8133 (2007);

(26) G. Torsello et al., The origin of highly efficient selective emission in rare-earth oxides for thermophotovoltaic applications, Nature Materials 3, 632-637 (2004);

(27) E. Purcell, Physical Review, (1946), vol. 69, p. 681;

(28) K. J. Vahala, Optical microcavities, Nature 424, 839-846 (2003);

(29) M. Oxborrow, Traceable 2-D Finite-Element Simulation of the Whispering-Gallery Modes of Axisymmetric Electromagnetic Resonators, IEEE Transactions on Microwave Theory and Techniques 55, 1209-1218 (2007);

(30) G. E. Guazzoni, High-Temperature Spectral Emittance of Oxides of Erbium, Samarium, Neodymium and Ytterbium, Appl. Spectrosc. 26, 60-65 (1972);

(31) H. Höfler, P. Würfel, W. Ruppel, Selective emitters for thermophotovoltaic solar energy conversion, Solar Cells 10, 257-271 (1983);

(32) M. Cai, O. Painter, K. J. Vahala, P. C. Sercel, Fiber-coupled microsphere laser, Opt. Lett. 25, 1430-1432 (2000);

(34) J. R. Howell, R. Siegel, M. P. Mengüc, Thermal Radiation Heat Transfer, 5th Edition (CRC Press, ed. 5, 2010);

(35) D. V. Seletskiy et al., Laser cooling of solids to cryogenic temperatures, Nature Photonics 4, 161-164 (2010);

(36) H. Mashaal, A. Goldstein, D. Feuermann, J. M. Gordon, First direct measurement of the spatial coherence of sunlight, Opt. Lett. 37, 3516-3518 (2012); and

(37) T. Yabe et al., Demonstrated fossil-fuel-free energy cycle using magnesium and laser, Applied Physics Letters 89, 261107-261107-3 (2006).

The disclosures of all references mentioned above and throughout the present specification, as well as the disclosures of all references mentioned in those references, are hereby incorporated herein by reference.

SUMMARY OF THE INVENTION

There is provided in accordance with an exemplary embodiment of the invention, a method of emitting photons at a desired wavelength, comprising:

(a) providing a material having a first energy state region of high absorption of radiation at a first set of wavelength of radiation, contiguous with a second energy state region of low absorption of radiation at a shorter set of wavelengths, said second region contiguous with a third energy state region of high emission at a further shorter set of wavelength;

(b) applying energy to said material at said first region, such that most of the applied energy occupies non- or weakly emitting energy states including in said second region; and (c) emitting energy from said material at said third region, powered by said applying energy. Optionally, said applying comprises transferring energy to surface phonon polaritons at said first and second regions, thereby increasing a density of populated energy states of said material at said first and second regions. Optionally or alternatively, said material and said applying are selected to match so that said material has a high density of surface phonon polariton modes at a wavelength of said applying of energy.

In an exemplary embodiment of the invention, said applying comprises applying energy to heat said material so that most of said energy occupies said second region and in an overlap with said third region.

In an exemplary embodiment of the invention, said applying comprises applying energy to heat said material so a distribution of radiative states according to a black body model of the material mostly overlaps with said second region and also overlaps with said third region.

In an exemplary embodiment of the invention, said material is shaped to encourage surface phonon propagation.

In an exemplary embodiment of the invention, said material is shaped as a sphere or spheroid, or cylinder.

In an exemplary embodiment of the invention, said material is provided in a cavity or in the form of a cavity with a resonance at said third region.

In an exemplary embodiment of the invention, said material is coupled to a fiber to carry incoming energy and/or carry away said emitted energy.

In an exemplary embodiment of the invention, the method comprises providing a cavity which resonates at said third region, thereby increasing a density of energy states of said material at said third region.

In an exemplary embodiment of the invention, the method comprises driving a distribution of energy states in said material by said applying and wherein said emitting comprises conversion of states at said third region into radiation. Optionally, said driving comprises driving by entropy.

In an exemplary embodiment of the invention, said applying energy comprises heating using a laser with a wavelength longer than any wavelength in said third region.

In an exemplary embodiment of the invention, said applying energy comprises heating using solar radiation. Optionally, said solar radiation is concentrated.

In an exemplary embodiment of the invention, said applying energy comprises heating using heat convection.

In an exemplary embodiment of the invention, said emitting comprises emitting as coherent radiation.

In an exemplary embodiment of the invention, said emitting comprises emitting as illumination.

In an exemplary embodiment of the invention, the method comprises collecting said emitted radiation and converting said collected radiation into electrical energy.

In an exemplary embodiment of the invention, the method comprises collecting said emitted radiation and converting and storing said collected radiation.

In an exemplary embodiment of the invention, the method is used for up-converting laser radiation.

In an exemplary embodiment of the invention, said third region is provided by a dopant in or coating on a material or materials which define said first and said second regions. Optionally, said dopant is selected from a group consisting of rare earth metals and alloys thereof.

In an exemplary embodiment of the invention, said third region has a width of less than 20 nanometer.

In an exemplary embodiment of the invention, said third region has a width of between 0.0.02 and 2 micron.

In an exemplary embodiment of the invention, said third region has a width of less than 1 nanometer.

In an exemplary embodiment of the invention, said third region has a width of less than 1 angstrom.

In an exemplary embodiment of the invention, said third region overlaps with a photovoltaic region of a conversion efficiency of over 20%.

In an exemplary embodiment of the invention, said first and second regions are provided by a base material selected from the group of SiO2, Sapphire, CaF2, BaF2, LiF, Rutile, CaCo3.

In an exemplary embodiment of the invention, said first region has a shortest wavelength of at least 2 microns.

In an exemplary embodiment of the invention, said first region has a shortest wavelength of at least 1.5 microns.

In an exemplary embodiment of the invention, said first region has a shortest wavelength of at least 0.5 micron.

In an exemplary embodiment of the invention, said second region has a shortest wavelength of at least 1.05 micron.

In an exemplary embodiment of the invention, said second region has a shortest wavelength of at least 0.82 micron.

In an exemplary embodiment of the invention, said second region has a shortest wavelength of at least 0.72 micron.

In an exemplary embodiment of the invention, said second region has a shortest wavelength of at least 0.75 micron.

In an exemplary embodiment of the invention, said second region has a shortest wavelength of at least 123 nm.

In an exemplary embodiment of the invention, said second region has a shortest wavelength of at least 142 nm for Sapphire.

In an exemplary embodiment of the invention, said third region has a longest wavelength of about 1 micron.

In an exemplary embodiment of the invention, said third region lies at a wavelength longer than a peak wavelength of said effective black body radiation.

In an exemplary embodiment of the invention, said material is thermally insulated.

In an exemplary embodiment of the invention, said emitted radiation is an up-conversion of said applied energy.

There is provided in accordance with an exemplary embodiment of the invention, a method of emitting photons at a desired wavelength, comprising:

heating an object having a physical emission window at said desired wavelength using a first wavelength as an heating source; and converting said heat by solid state behavior of said object into radiation at a higher wavelength than said first wavelength. Optionally, said converting does not utilize electronic circuitry or mechanical machinery.

There is provided in accordance with an exemplary embodiment of the invention, apparatus for energy conversion, comprising:

a body comprising a material with a low emissivity window at a range of wavelengths and a high emissivity window at a shorter range of wavelengths, said body defining at least one portion thereon for coupling to an energy source and at least one portion thereon for emitting radiation at said high emissivity window. Optionally the body is under vacuum. Optionally, the body is under partial pressure of 500 mBar or less. Optionally, the body is under partial pressure of 300 mBar.

Optionally, the apparatus comprises an energy source or optics for conveying energy to said coupling portion.

Optionally or alternatively, the apparatus comprises insulation configured to maintain a temperature of said body. Optionally or alternatively, the apparatus comprises a controller which controls an application of energy to said body. Optionally or alternatively, the apparatus comprises or is formed into a cavity with resonance at said high emissivity window. Optionally, said cavity provides surface modes. Optionally or alternatively, said cavity is formed on a surface of said body. Optionally or alternatively, said cavity is spherical. Optionally or alternatively, said cavity is mirrored.

In an exemplary embodiment of the invention, said body comprises a main material which provides said low emissivity window and one or more coatings and/or dopings which provide said high emissivity window.

In an exemplary embodiment of the invention, the apparatus comprises a photo-voltaic converter optimized to receive radiation at said high emissivity window and generate electricity therefrom.

In an exemplary embodiment of the invention, the apparatus comprises a storage unit configured to receive radiation at said high emissivity window and convert said radiation into stored energy. Optionally, the apparatus comprises an energy generate which receives said stored energy and converts said stored radiation into radiation applied to said body.

In an exemplary embodiment of the invention, the apparatus is configured to output said radiation as a laser illumination. Optionally, the apparatus comprises a laser source at a wavelength longer than said high emissivity window wavelength and coupled to said coupling portion of said body.

In an exemplary embodiment of the invention, the apparatus comprises optics which shape said emitted radiation.

In an exemplary embodiment of the invention, the apparatus comprises optics for concentrating solar radiation on said body. Optionally, said body is formed of a material absorptive at solar radiation wavelengths.

In an exemplary embodiment of the invention, said coupling portion comprises a contact location for convective heating.

In an exemplary embodiment of the invention, said body comprises SiO2 and a rare earth.

There is provided in accordance with an exemplary embodiment of the invention, a laser up-converter, comprising:

a laser source which radiates radiation at a first wavelength;

a body positioned to receive said radiation at said first wavelength and which couples said radiation to radiation at a wavelength shorter by a factor of at least 2.5 at an efficiency greater than 0.4%; and optics for receiving laser radiation from said body at said shorter wavelength. Optionally, said factor is at least 7.

There is provided in accordance with an exemplary embodiment of the invention, a solar pumped laser, comprising:

a body configured to receive solar radiation at a concentration of at least 4 suns;

a cavity formed of or around said body; and optics for conveying laser radiation from said cavity.

There is provided in accordance with an exemplary embodiment of the invention, an energy converter, comprising:

a body configured to receive heat or solar radiation, and having an emission peak; and a photo-voltaic cell configured to receive radiation at said emission peak and to convert said radiation to electrical energy.

There is provided in accordance with an exemplary embodiment of the invention, a chemical processor, comprising:

a body configured to receive heat or solar radiation, and having an emission peak; and a chemical reaction chamber configured to receive radiation at said emission peak and provide said radiation to one or more chemically reacting materials.

There is provided in accordance with an exemplary embodiment of the invention, a chemical processor, comprising:

a body configured to receive heat or solar radiation, and having an emission peak; and a chemical reaction chamber configured to be in thermal contact with a lasing mode volume working at said peak which provides said excitation to one or more chemically reacting materials.

There is provided in accordance with an exemplary embodiment of the invention, a device for up-converting 10.6 µm radiation to 1 µm radiation at an internal efficiency above 27% substantially as described above.

There is provided in accordance with an exemplary embodiment of the invention, a device for up-converting 10.6 µm radiation to 980 nm radiation at a total efficiency above 10% substantially as described above.

There is provided in accordance with an exemplary embodiment of the invention, apparatus for producing electric power from radiation including a first radiation absorber and emitter material having a first band-gap Eg1 configured so as to absorb incident radiation, a second photovoltaic material having a second band-gap Eg2 configured so as to absorb radiation emitted from the first radiation absorber and emitter material, and electric contacts electrically connected to the second photovoltaic material so as to provide an output of electric power.

In an exemplary embodiment of the invention, the first band-gap Eg1 is smaller than the second band-gap Eg2.

In an exemplary embodiment of the invention, the apparatus further includes a reflector for reflecting radiation emitted from the second photovoltaic material onto the first radiation absorber and emitter material.

In an exemplary embodiment of the invention, the reflector is configured to reflecting radiation not absorbed by the second photovoltaic material onto the first radiation absorber and emitter material.

In an exemplary embodiment of the invention, the apparatus further includes a reflector for reflecting radiation not absorbed by the second photovoltaic material onto the first radiation absorber and emitter material.

In an exemplary embodiment of the invention, a space exists between the first radiation absorber and emitter material and the second photovoltaic material.

In an exemplary embodiment of the invention, the space includes a vacuum.

In an exemplary embodiment of the invention, the apparatus further includes an optical element for concentrating the incident radiation onto the first radiation absorber and emitter material.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1 is a schematic showing a method of energy up-conversion in accordance with an exemplary embodiment of the invention;

FIGS. 2A and 2B are flowcharts of methods of energy up-conversion in accordance with an exemplary embodiment of the invention;

FIG. 3 is a schematic block diagram of an energy conversion system, in accordance with an exemplary embodiment of the invention;

FIG. 4 is a table showing optical transparency properties for some materials useful in carrying out some embodiments of the invention;

FIG. 5 is a flowchart showing a method of energy down-conversion in accordance with an exemplary embodiment of the invention;

FIG. 6A is a schematic block diagram of a solar-pumped laser in accordance with an exemplary embodiment of the invention;

FIG. 6B is a schematic showing of a solar-pumped laser in accordance with an exemplary embodiment of the invention;

FIG. 7 is a schematic block diagram of an energy up-converter coupled with a PV converter, in accordance with an exemplary embodiment of the invention;

FIG. 8 is a schematic block diagram of a solar storage system, in accordance with an exemplary embodiment of the invention;

FIG. 9 is a schematic block diagram of a short wavelength laser source, in accordance with an exemplary embodiment of the invention;

FIGS. 10A-10C show an experimental setup used to illustrate some embodiments of the invention;

Figure 10A:
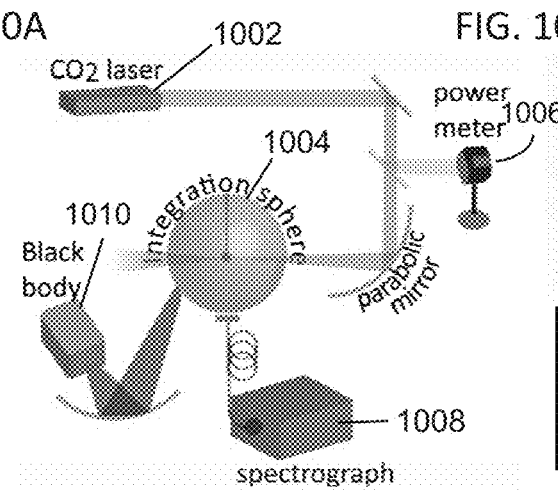
Figure 10B:
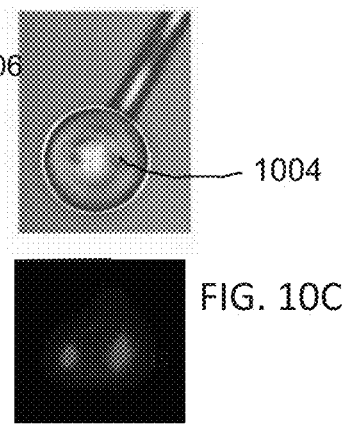
Figure 10C:
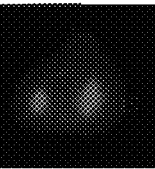
Figure 11B:
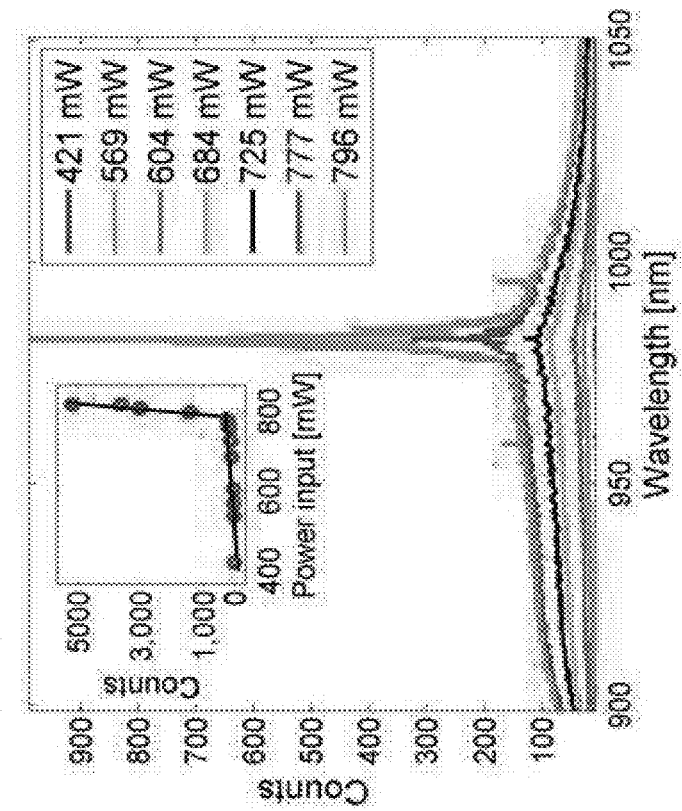
Figure 11A:
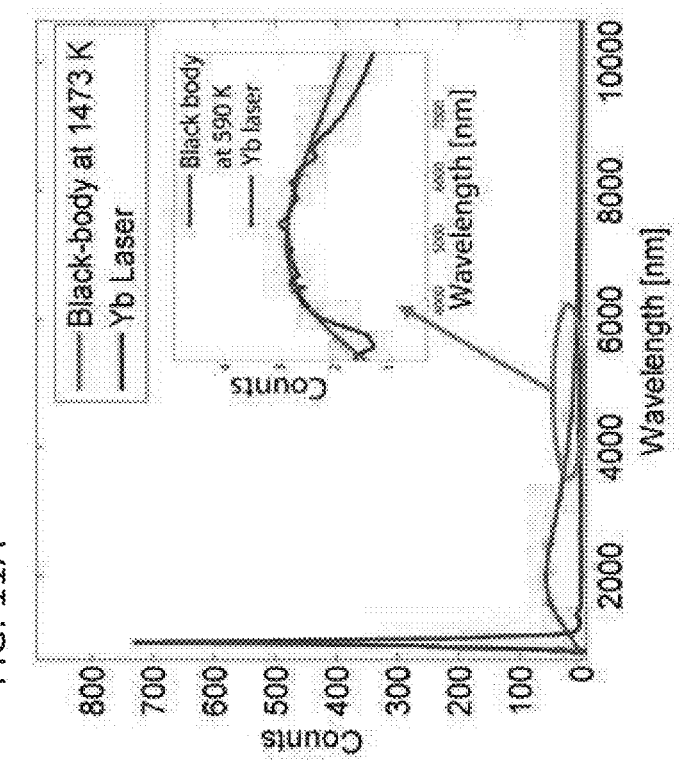
Figure 12:
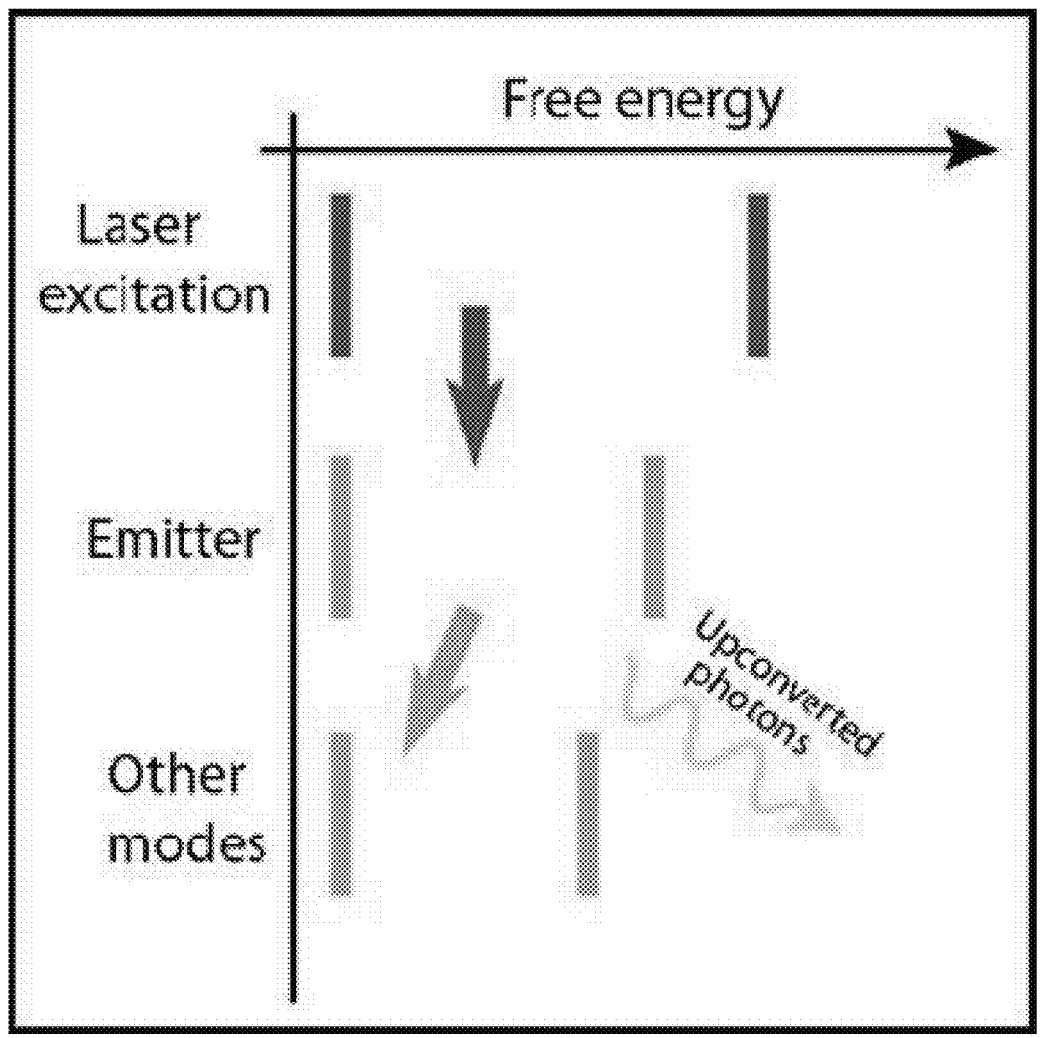
Figure 15A:
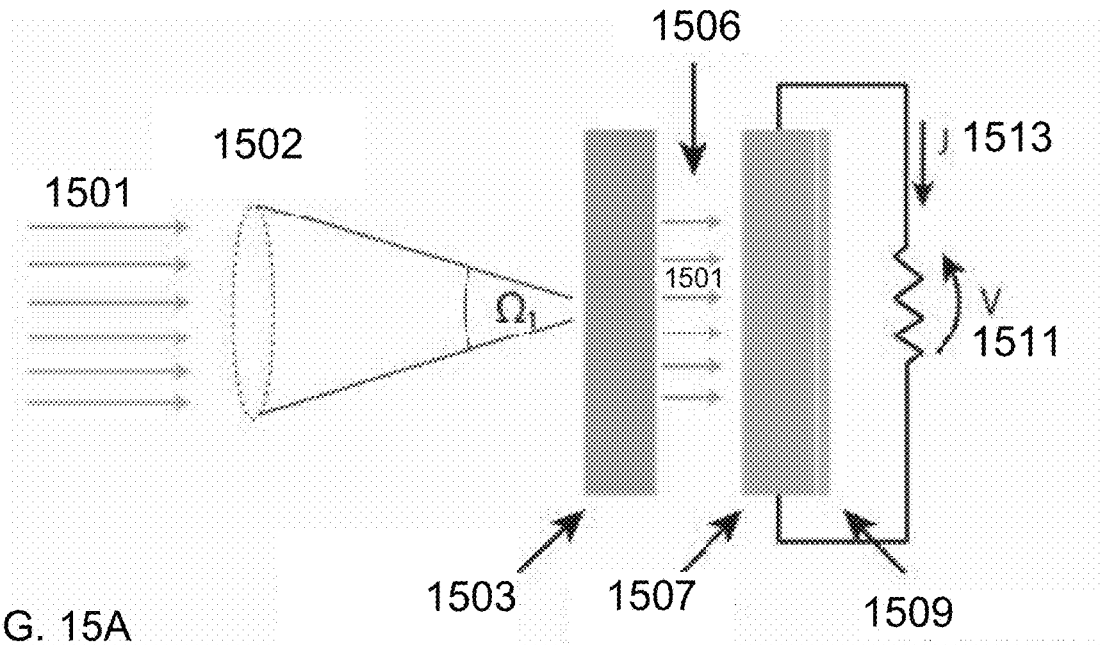
Figure 15B:
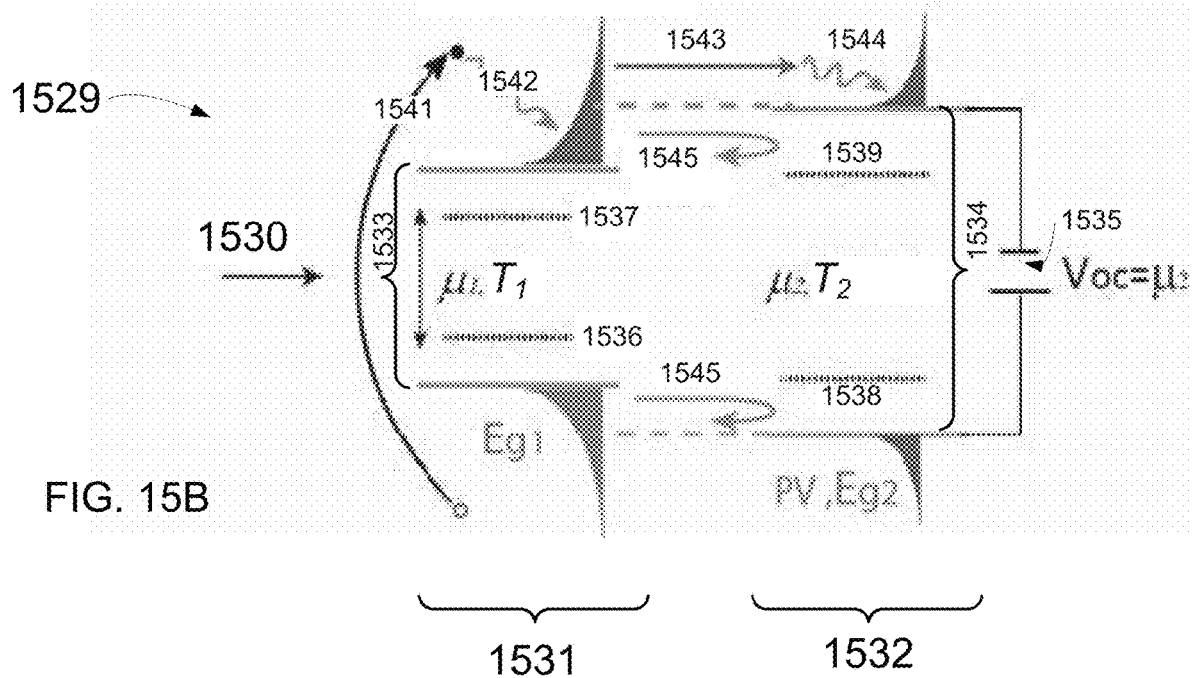

FIG. 10D show an exemplary setup used for carrying out some embodiments of the invention;

FIGS. 11A-11B show results of experiments using the setup of FIGS. 10A-10C;

FIG. 12 is a simplified illustration of a free energy diagram of a frequency up-conversion process according to an example embodiment of the invention;

FIGS. 13A-13C are simplified illustrations of the experimental setup used in the additional example embodiment of the invention;

FIGS. 14A-14D illustrate experimental results obtained with example embodiments of the invention;

FIG. 15A is a simplified illustration of an example embodiment of the invention; and FIG. 15B is a simplified schematic illustration showing an energy diagram up-conversion in accordance with an exemplary embodiment of the invention.

DESCRIPTION OF SPECIFIC EMBODIMENTS OF THE INVENTION

Overview

The present invention, in some embodiments thereof, relates to an energy conversion system and, more particularly, but not exclusively, to a conversion system which up-converts energy from longer wavelengths to shorter wavelength.

A broad aspect of some embodiments of the invention relates to energy conversion in which energy is coupled from one (or more) longer wavelength to a shorter wavelength using solid state energy coupling in a material. Optionally, the material has a low emissivity window between the one wavelength and the shorter wavelength, to reduce energy loss at that window. In an exemplary embodiment of the invention, the material is formed into a body which uses surface characteristics thereof (e.g., polaritons) to assist said energy transfer. In an exemplary embodiment of the invention, surface modes, rather than volume modes are used to transfer energy.

In an exemplary embodiment of the invention, energy at said one wavelength is used to occupy energy states in non-radiative energy sates and then energy at these states is siphoned off using a high emissivity peak and/or a resonant cavity and/or surface structures, such as gratings or prisms.

An aspect of some embodiments of the invention relates to a method of energy conversion in which energy is provided to a body at one wavelength and selectively emitted at another wavelength. In an exemplary embodiment of the invention, the provided energy fills energy states in the body using an entropy driven mechanism, which heats the body to a temperature where its black body emission is at shorter wavelength than the low entropy source photons. Optionally, the energy is emitted at a high-emissivity wavelength region which overlaps with said occupied energy states (as defined by the body temperature). In an exemplary embodiment of the invention, the high-emissivity wavelength region overlaps with the occupied energy states by less than 90%, 80%, 50%, 30%, 10% or intermediate or smaller overlap. Optionally or alternatively, the high-emissivity wavelength substantially overlaps only energy states occupied with energies at less than 90%, 80%, 50%, 30% or intermediate percentages of a peak occupied state. In an exemplary embodiment of the invention, the emission peak is at an effective temperature which is at least 30% (or at least 200%, or at least 1000% or intermediate percentages) higher than a temperature as defined by said energy states. In an exemplary embodiment of the invention, said body has a low emissivity over a range of wavelengths that covers at least 30%, at least 50%, at least 80%, at least 90% or intermediate percentages of wavelengths that would be emitted if the body were a black body with the occupied energy states. In some embodiments, the emission wavelength is longer than a wavelength of peak energy.

In an exemplary embodiment of the invention, the emission at the low emissivity region comprises less than 90%, 80%, 50%, 5% or intermediate percentages of the total emission by said body. Optionally, this region is provided to avoid and/or reduce radiative loss.

In an exemplary embodiment of the invention, the properties of the body are provided by two or three different materials, optionally not mixed together. For example, absorption may be provided by one material, which is coupled to a second material which provides the transparency and which is coupled to a third material (or the first material) to provide the emissions. Thus, in an exemplary embodiment of the invention, the second material serves as an energy reservoir to which incoming energy is coupled and from which energy is coupled to emission.

In an exemplary embodiment of the invention, the emissivity of the emitting high emissivity region is greater by a factor of, for example, 10, 100, 1,000, 10,000, 100,000 or greater or intermediate factors from a low emissivity of the low emissivity wavelength range, or at least of 90% or 95% or more thereof. In one example, the high emissivity is between 0.5 and 1 and the low emissivity is less than 0.1.

In an exemplary embodiment of the invention, a width of the low emissivity window is greater by a factor of 10, 100, 1000, or intermediate or greater factors than the width of the high emissivity window. It is noted that in some embodiments, the high emissivity window may be large, however.

In an exemplary embodiment of the invention, the slope of the high emissivity window at the longer wavelength side is high, such that, for example, emissivity increases by a factor of at least 10, 100, 1000 or intermediate or greater factors, within a range of wavelengths, of, for example, 100 microns, 10, microns, 0.1 microns and/or smaller or intermediate or greater ranges.

In an exemplary embodiment of the invention, the low emissivity region covers wavelengths containing at least 30%, at least 50%, at least 70%, at least 90% or intermediate or greater percentages of energy in radiative states.

An aspect of some embodiments of the invention relates to an entropy driven laser, in which low energy coherent photons are used to drive a shorter wavelength lasing effect, for example, with an up-conversion of at least a factor of 2, 3, 4, 5, 6, 10 or intermediate or greater factors. In an exemplary embodiment of the invention, the efficiency of conversion (e.g., ignoring heat loss) is at least 0.5% 15, 3%, 5%, 10%, 20%, 30%, 50% or intermediate or greater efficiencies.

In accordance with an exemplary embodiment of the invention, the inventors have realized that taking into account the complete thermodynamic picture work can also be achieved by a change in a system's entropy. Apparently, the temperature and entropy term, [T·S] has never been used before as a pump and the inventors have realized that it offers an additional, independent route for new pump mechanisms. This route allows pumping with coherent photons at lower energy than the photoluminescence photons. Here the entropy, as defined by the pump coherence, governs the amount of up conversion that can be achieved. In particular, utilizing this change in entropy one can eliminate the need high chemical potential excitation photons and enable lasing with excitation of much lower chemical potential than is emitted.

In an exemplary embodiment of the invention, a laser with an up-conversion of a factor of above 10 is provided, for example, a lasing at less than 1000 nm is provided (e.g., Ytterbium laser at 980 nm) using a pumping at more than 10 microns (e.g., CO2 laser at 10.6 microns).

In an exemplary embodiment of the invention, a solar pumped laser is provided in which direct or optionally concentrated sunlight (e.g., by a factor of 2, 5, 10, 100, 1000, 10000 or intermediate or greater values) is used to pump a laser. Optionally, the laser has a wavelength shorter than the peak wavelength of radiation of the sun.

In an exemplary embodiment of the invention, up-conversion is used to convert laser radiation at one wavelength to laser radiation at a shorter wavelength, for example, to provide UV or soft x-ray lasers. As an example the emitter can be one of known UV emitters. The phosphor typically used for a near 368 to 371 nanometer emission peak is either europium-doped strontium fluoroborate ($SrB_4O_7:Eu^{2+}$) or europium-doped strontium borate ($SrB_4O_7:Eu^{2+}$), whereas the phosphor used to produce a peak around 350 to 353 nm is lead-doped barium silicate ($BaSi_2O_5:Pb^+$). Also mercury can be modified to produce a UVA, UVB emission.

In an exemplary embodiment of the invention, the body is in or forms a cavity or other resonant structure, to enhance emission at the wavelengths of the high-emission window. In one example, the body is spherical. In another example, the body is placed between reflective surfaces, which are optionally used also for preventing heat loss.

In an exemplary embodiment of the invention, of a sphere coupled to a fiber, energy input and/or output is optionally via the fiber. In an alternative example, emission is in a plane which is shared with a ring on the body which defines the resonance. In an example of a body in a mirrored chamber, emission is optionally through a less reflecting part of the mirror.

An aspect of some embodiments of the invention relates to a heat to electrical converter in which the converter converts energy at multiple wavelengths to energy at a single or small number of peaks and which utilizes a high efficiency photo-converter optimized for said peak or peaks.

An aspect of some embodiments of the invention relates to an energy conversion system which utilizes surface phonon polaritons to enhance energy transfer between a set of low energy states and a set of high energy states, where the polaritons bridge a low or non-emissive region between the states and do not substantially emit at said low or non-emissive region.

An aspect of some embodiments of the invention relates to up-conversion of a laser to a shorter wavelength laser emission by first coupling a longer wavelength laser to a body via surface phonon polaritons and then coupling these polaritons to emission at a narrow, shorter wavelength. In an exemplary embodiment of the invention, the second coupling uses a rare earth as a coupler. Optionally, energy loss is reduced by choosing a body made of a material which does not emit too much at wavelengths intermediate said shorter and said longer wavelengths.

An aspect of some embodiments of the invention relates to providing a high effective temperature, as evidenced by emission wavelength without providing a real high temperature, as would be evidenced by black body radiation, on a body. In an exemplary embodiment of the invention, the lack of a real high temperature preventing melting and/or evaporation of the body. Optionally, the effective high temperature is used for energy storage, chemical reactions and/or photovoltaic output.

An aspect of some embodiments of the invention relates to a method of producing electric power from radiation, in which radiation is provided to a first material body at one wavelength and emitted at another, shorter wavelength. The shorter wavelength is then optionally absorbed by a photovoltaic cell, and produces electricity.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Exemplary Scheme

Figure 1:
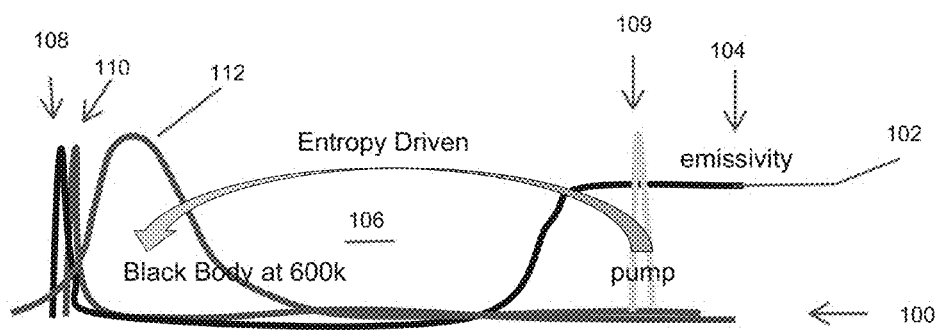
Figure 2A:
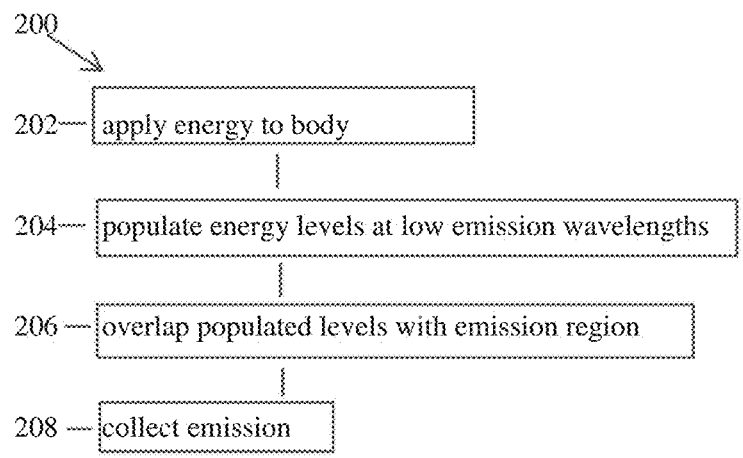
Figure 2B:
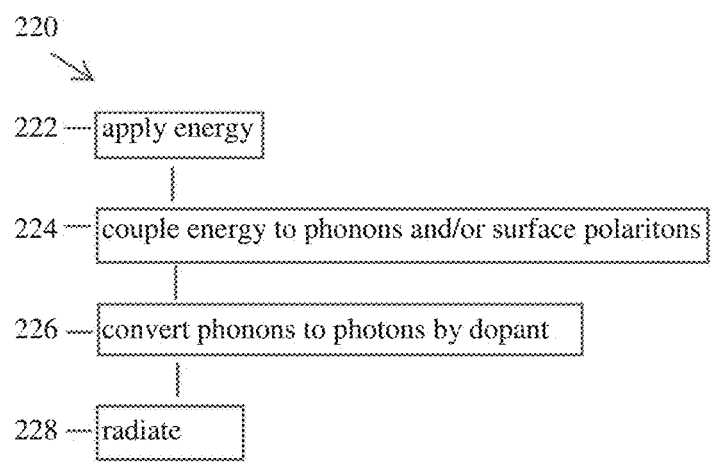
Figure 3:
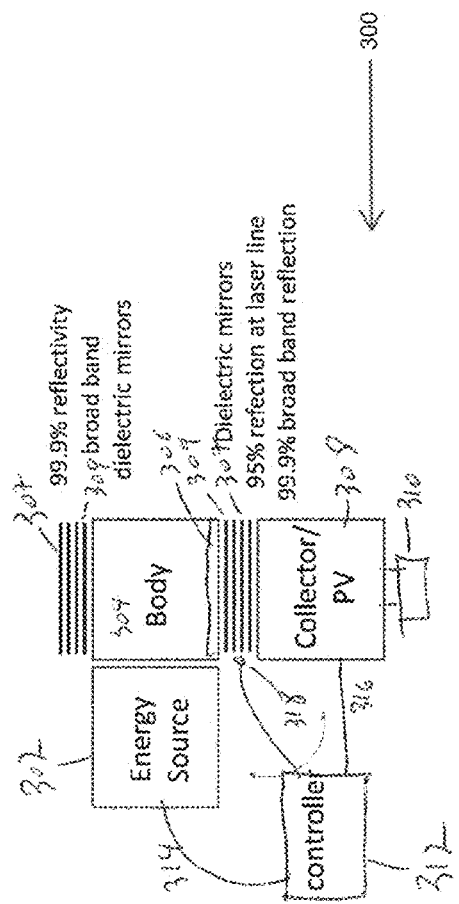

Referring now to the drawings, FIG. 1 is a schematic 100 showing a method of energy up-conversion in accordance with an exemplary embodiment of the invention, as a graph linking amplitude and wavelength (longer to the right). FIG. 2A and FIG. 2B are flowcharts of a method of energy up-conversion in accordance with an exemplary embodiment of the invention. FIG. 3 is a schematic block diagram of an energy conversion system 300, in accordance with an exemplary embodiment of the invention.

Referring first to FIG. 3 and flowchart 200 of FIG. 2A, at 202, an energy source 302 provides energy to a body 304. As will be described below, the energy may be provided in various manners, including, for example, waste heat, chemically-generated heat, light, laser radiation, other electromagnetic radiation, sunlight and/or combinations of the above. It is a particular property of some embodiments of the invention that a wide range of heat may be usefully converted, even simultaneously.

At 204, the energy is used to populate energy levels at a low emission wavelength of body 304. This is now explained with reference to FIG. 1. Body 304 has an emissivity characterized (as a function of wavelength) by curve 102. At long wavelengths, for example, at which energy source radiation 109 is coupled, body 304 has a high emissivity. At a second range of wavelengths, 106, body 304 has a low emissivity. Thus, even though a curve 112 that indicates the behavior of a black body at this range indicates significant energy, this energy is not efficiently emitted. In some embodiments, the energy is stored in non-emitting states, such as surface phonon polaritons.

At 206, energy is sufficient to populate levels overlapping with an emission window 108. Optionally, this window is provided by coating body 304 with a suitable coating 306 or by doping all or part (e.g., a surface portion) of body 304. The doping may include, for example, rare earth materials, semi-conductor materials, organic materials, and/or any other material known to emit at a desired peak or region and/or which affects the body to affect at such a peak. The window may be, for example, sub nanometer full width half max narrow emission, as shown or above 1μ full width half max emission width. Intermediate, greater or smaller widths may be provided as well. In some embodiments, the energy populates non-emitting levels that overlap emission window 108, but black body radiative states do not so overlap.

At 208, emissions at a wavelength range 110 corresponding to an overlap between the energy states and the emission window are collected, for example, by a collector 308. Optionally, the emissions are used, for example, as a laser source or a narrow beam light source. Optionally, the collector comprises a converter to electrical energy used to power a load 310.

Optionally, system 300 includes an insulation layer 307 to maintain the temperature of body 304. In an exemplary embodiment of the invention, insulation is provided by reflective mirrors 309, which also serve to define a resonant cavity for body 304. In some embodiments, body 304 is shaped in the form of a cavity, for example, a sphere.

In an exemplary embodiment of the invention, a controller 312 is provided which may, for example, control energy provision via a control circuit 314 (e.g., add or decrease fuel in a chemical heat source). Optionally or alternatively, controller 312 uses a sensor 318 to determine if a desired emission is being achieved, optionally changing the energy provision in response. Optionally or alternatively, a sensor 316 receives a signal from, for example, collector 308 or load 310 indicating a total efficiency or amount of energy conversion.

In a particular embodiment, described in more detail below, energy 109/source 302 is CO2 laser light at 10.6 microns, concentrated on a SiO2 body 304 and layer 306 is a doping of Ytterbium on a tip of a SiO2 fiber optic, melted to form a sphere, which acts as an optical cavity for lasing.

Referring briefly to FIG. 2B a possible explanation is provided using a flowchart 220. At 222, energy is provided, as before. At 224, the provided energy is coupled to phonons in body 304 and/or to surface phonon polaritons. At 226, the phonons and/or polaritons are converted, for example, by doping/coating 306 into photons and emitted (228). In such a case the high emissivity window at short wavelength (110) doesn't need to overlap with the black body emission (112) of said body, but only direct nonlinear coupling between the phonon polaritons (at low frequency) and the emitter (at high frequency) is needed.

Possible Hypotheses

Without being necessarily limited by one hypothesis or another, parameters for some embodiments of the invention may be more usefully optimized using a theoretical model, such as provided below. However, while these hypotheses can be used to define parameters for some embodiments of the invention, incorrectness of one or more of these hypotheses does not lead to invalidation of the description of particular embodiments of the invention.

In a possible way to explain the thermodynamic reasons that allow low entropy to generate efficient extreme up-conversion and laser work, it may be constructive to consider the following process: Coherent beams can be considered as having an entropy approaching zero and thus temperature approaching infinity. This allows a CO2 laser beam to be focused to generate maximum photon flux that heats a SiO2 optical cavity to a temperature much above 3500 kelvin. At thermodynamic equilibrium, this body emits at all frequencies according to Plank's formula at the (same) body temperature. For temperatures above 3500 kelvin most of black body photons are at the visible and Near IR part of the spectrum. Therefore, a black body at 3500 kelvin can be used as a pump source for lasing at 1 micron by red shifting the pump photons in a conventional lasing media of three or four energy levels scheme. In such a description the efficiency of generating pump photons at the visible is similar to other heating through radiation processes such as solar thermal, which can approach unity.

However, this description cannot be correct for the example of FIGS. 1-3 and for the experiment described below with respect to FIGS. 10-11, as most of the black body pump photons energy must exceed the lasing energy photons at 1μ, the temperature of the pump source (body 304) must exceed 3500 Kelvin. This is far above the melting point, at 1600 kelvin and even the evaporation point at 2400 kelvin of body 304, when formed from $SiO_2$.

As shown by the experimental results, the actual emission by body 304 at wavelengths other than the lasing wavelengths resembles a black body emission at 600 kelvin reduced by low emissivity at those emission wavelengths. It is hypothesized that what is at work is the huge difference in emissivity between the SiO2 and Ytterbium. SiO2 is one of the most transparent materials between 0.4 micron and 2.4 micron wavelengths, which according to Kirchhoff's law of thermal radiation, is accompanied by negligible emissivity at that range. Ytterbium on the other hand, has emissivity approaches unity at 1 micron, which together with an optional Purcell effect of the cavity results in efficient Ytterbium emission. This interpretation can be tested, when comparing the Ytterbium emission without the cavity and black body emission at 600 Kelvin. By definition a black body has emissivity of one and therefore if Ytterbium emission is part of a system in thermodynamic equilibrium it must be lower than the black body emission. However, the experiments described below show emission at an amplitude greater than predicted by black body radiation by a factor greater than 2.

One possible hypothesis is as follows. The coherent CO2 excitation excites single (or numerous) phonons, through vibration modes of body 304. That is, the non-equilibrium laser excitation is projected to a discrete phonon population at huge amplitude at effective high temperature. Since SiO2 is transparent between 400 nm and 2.4 microns wavelength, the possibility of multi phonon up-conversion as a result of phonon scattering in the SiO2 is weak. Ytterbium on the other hand has high emissivity at 1 micron and is known to convert thermal excitation to emission. Inventors hypothesize that direct conversion of the discrete excited phonons to photons are done at the YbO3 molecules used as a dopant in layer 306. The residual non-radiative energy is scattered to many phonons. As many modes are excited the system shift towards thermodynamic equilibrium and the temperature can be defined and set at 600 kelvin. In other words, because of the enhanced emissivity of Ytterbium compared to SiO2, the Ytterbium excitation rate is preferred over the SiO2 heating (scattering too many phonons).

In an exemplary embodiment of the invention, what is done is using an energy source at low entropy so as to allow low energy photons (at long wavelength) to heat a body to such a high temperature where it's black body emission will be at wavelength much shorter than the energy source. If a body has a high absorption at the long wavelength and a high transparency at a shorter wavelength (e.g., the transparent window) the body, when heated to a high enough temperature, cannot efficiently emit the photons and therefore will store the energy. If a body with such transparent window has a strong emitter at a short wavelength the stored energy can only radiate from the body at the strong emitter wavelength. The effective outcome is conversion of long wavelength of the initial energy source to shorter wavelength of the heated body emitter, without electronic conversion or mechanical mechanism, but possibly using solid state physics.

Another possible hypothesis to explain the efficient energy transfer to the Ytterbium is excitation through surface phonon polaritons. Conventionally, surface modes must be coupled to radiative excitations by a prism or grating in order to overcome the momentum mismatch. $SiO_2$ absorption cross section at $CO_2$ excitation is very high, result in excitation absorption at a length shorter than wavelength. At such short distances momentum mismatch between the photon and the excited phonon may be eliminated, which allows to couple surface phonons to free space radiation. $SiO_2$ has high density of surface phonon polariton modes (SPhP) in the spectrum close to the $CO_2$ emission, therefore it is expected that much of the energy is coupled to the SPhP. When using a spherical body 304 which also acts as a resonator, body 304 supports whispering-gallery modes at the sphere surface, which enhance the Ytterbium emission through the Purcell effect. The SPhP conservation of the energy at the surface, where the cavity modes are located, enhances the total energy transferred to Ytterbium emission. Possibly, under this interpretation, one cannot assign a temperature to this non-equilibrium Ytterbium emission, and it cannot be defined if emissivity is above unity, which indicates a gain process. Optionally, surface heating is by other means, for example, IR radiation, RF, ultrasound contact heating and/or convection heating.

It is noted that Dye-Zone A. Chan [PhD thesis MIT 2007] have shown that the density of states near the surface of dielectric materials such as $SiO_2$ and metals is much higher than remote from the surface by orders of magnitude due to surface modes. In polar materials such as $SiO_2$ these modes are surface phonons polaritons, which directly enhance heat conductivity and heat capacity. As shown in the above thesis there is a 1000 fold enhancement of DoS on the surface. In other embodiments, a lesser enhancement (or none), such as a factor of 0.5, 1, 2, 10, 100, 300 or intermediate or smaller or greater factors, may be used, or a factor of more than 100, such as 200, 5000 or more may be provided. Such modes are generally not radiative unless coupled to the free space by prism or grating.

As the propagation length of SPhP is, for example, in the order of 1 meter, which means that the SiO2 cavity at the size of sub millimeters supports whispering gallery phonons modes [Carmon, and Vahala, Phys. Rev. Lett. 98, 123901 (2007)]. Optionally, the cavity enhances SPhP amplitude by its Q factor. Optionally, a Direct coupling between the Ytterbium to the SPhP excite its 1 micron emission via a nonlinear process in the Ytterbium. In this case curve 112 can be ignored due to the up-conversion at the Ytterbium. Materials with other propagations lengths, for example, a factor of 2, 4, 6, 10, 500, 1000 or smaller or intermediate factors as a function of the size of the cavity/body, may be used.

Exemplary Materials

In an exemplary embodiment of the invention, body 304 is formed one or more materials so as to have the following properties: a region 104 of high emissivity (and energy absorption), one or more regions 106 of low emissivity, so that body 304 can be heated so most black body radiation overlaps with low emission and one or more regions of high emission 108, formed, for example, as a peak or as a wider emission window.

In the example above, SiO2 doped with Ytterbium provides this desired mix.

In an exemplary embodiment of the invention, region 104 is selected according to the desired input wavelengths and according to the operating temperature.

Region 106 is selected so that most (e.g., at least 50%, at least 70%, at least 90%, at least 95% or intermediate percentages) of the black body emission overlaps with low emissivity wavelengths (e.g., emissivity less than 0.3, 0.2, 0.1, 0.04, 0.01 or intermediate emissivities).

Region 108 is optionally selected according to a desired emission wavelength.

As can be appreciated different combinations of materials and properties are useful for different situations of input energy, operating temperature and desired emission.

Figure 4:
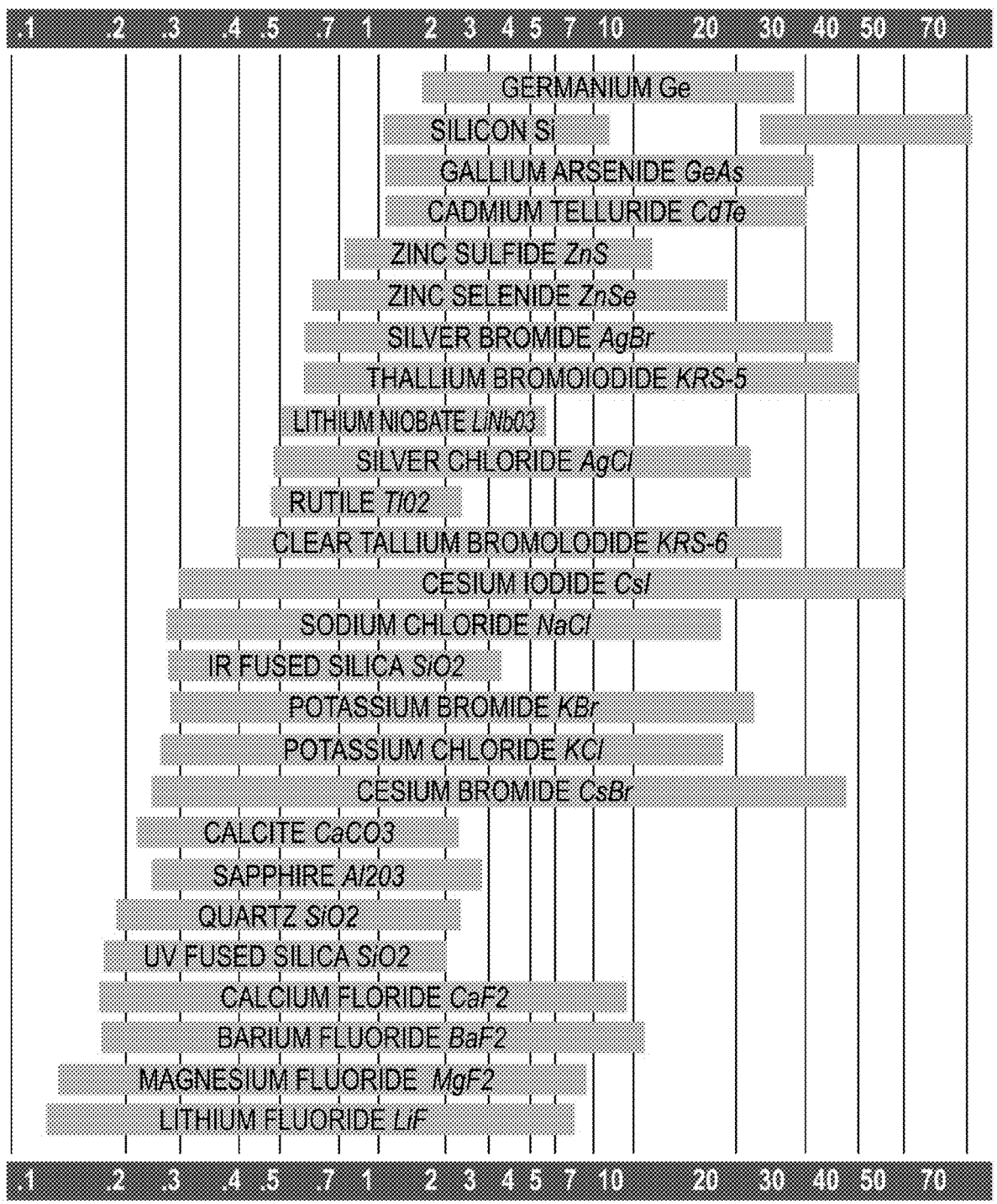

FIG. 4 is a table showing optical transparency properties for some materials useful in carrying out some embodiments of the invention. The ranges shown where the materials are transparent correspond to regions 106 and define what operating temperatures are useful and also where a peak 108 needs to be provided so as to cause efficient emission at that peak. Additional transparent materials used as conventional lasers hosts can be suitable. These include, among others: YAG (yttrium aluminum garnet), YVO4(yttrium orthovanadate), KY(WO4)2 potassium double tungstates, NaGd (WO4)2 (tetragonal double tungstates).

In an exemplary embodiment of the invention, body 304 is doped with or coated with a material which has a desired peak 108. In other embodiments an alloy or other formulation is selected according to its inherent emissivity curve 102. For example some rare earths, quantum dots, transition metals or metal nano-particles, semiconductor materials have high emissivity (and absorption) in the visible rang and low emissivity at longer wavelength. By adding small amount of these one can enhance visible light emissivity and absorption while maintaining transparency (and thus low emissivity) at the transparent window. Such addition can, for example, enhance the conversion of solar radiation to heat and thus to 1 micron emission (as described, for example, below).

In some embodiments, it is desired to have sub-wavelength absorption in the surface, for example, for polariton-based designs. Optionally, body 304 is coated with, for example, plasmonic materials such as metals which absorb visible light at sub wavelength distance, and organic and quantum dots which also absorb at near wavelength distance.

Some example dopants for absorption and/or emission include metals such as gold nano-particles at the size of tens of nanometers absorbs well in the visible and transparent at the Near IR (Nanoscape Volume 2, Issue 1, Spring 2005); Quantum dots such as CdSe/ZnS_core/shell_ Quantum Dots (QDs) at the size of a few nanometers are good absorbers at the visible and transparent at the Near IR (Applied Physics Letters 89, 191124 2006).

Rare earths for the visible and Near IR emission include Tb3+, Ce3+:LaPO4, Eu:Y2O3, Nd3+, Yb;

Other exemplary phosphors are listed in Shigeo Shionoya (1999). "VI: Phosphors for cathode ray tubes". Phosphor handbook. Boca Raton, Fla.: CRC Press. ISBN 0-8493-7560-6 and Jankowiak, Patrick. "Cathode Ray Tube Phosphors". Revision 20100226.1844.

It should be noted that if peak 108 is gradual in the direction of black body radiation curve 112, there will be a relatively broad range of frequencies of emission, which may be less than optimal for some applications. For example for energy conversion to 1µ wavelength, high emissivity at 1.2µ may drain most of the energy to 1.2µ emission.

Similarly, if there is overlap between region 104 and curve 112, significant amounts of energy may be emitted at such longer wavelengths.

Referring specifically to quantum dots, there are colloidal methods to produce many different semiconductors. Typical dots are made of or silicon binary alloys such as cadmium selenide, cadmium sulfide, indium arsenide, and indium phosphide. Their size is typically between 2 and 20 nm depending on their spectral activity (e.g., smaller size for shorter wavelength). Such quantum dots can be tuned by size to absorb the visible and emit at 1 micron and thus be used as a dopant for absorbing and/or for emitting and/or for coupling to an emitter.

In addition, metal (such as gold, silver, copper) nano-particles at sizes between 2 and 100 nm can be absorptive at the visible and transfer the energy to Ytterbium via Forester Energy Transfer.

Such nano-particles can be doped in the body to absorb solar spectrum or thermal radiation in the visible-near IR range, for example as described below.

Exemplary Cavity and Body Shapes

Body 304 can have various shapes, for example, to enhance energy application, energy emission and/or resonance. In an exemplary embodiment of the invention, a sphere is used. In an alternative embodiment, ring, round plate, a cylinder or ovoid shape is provided. In yet another embodiment, body 304 is, for example, rod or cube shaped and placed in a resonant cavity formed by mirrors. Examples of some body cavity design which may be used are described in text books such as "optical electronics in modern communication" and "Quantum Electronics" by Amnon Yariv.

In an exemplary embodiment of the invention, a slab laser cavity can be constricted in a thickness of less than a millimeter made from one of the transparent materials in table 4. An emitter is optionally doped on one or more of the surfaces by, for example, coating, sputtering or implanting. Optionally, the excitation hits the slab on the surface where the emitter is and the cavity is designed to support lasing at that surface by for example two planar mirrors.

Other cavities designs include spherical or fiber (e.g., at the circumference direction) which support surface modes. Additionally, a cavity made by a photonic band gap structure designed for surface modes can be used when coated by the emitter. Optionally, the mode volume is located on the surface and optionally has a depth of about the depth of the surface excited modes (of less than a millimeter).

In one example, body 304 has a diameter of less than 10 mm, less than 5 mm, less than 2 mm, less than 1 mm.

In another example, a slab with dimension of less than 200 mm, less than 30 mm and less than 10 mm is used.

Other body designs may be used, for example, with a maximal dimension of about 1 mm, 10 mm, 20 mm, 40 mm, 100 mm, 200 mm or intermediate or larger maximal dimensions. Optionally or alternatively, such a body may have a minimal dimension of about 1 mm, 10 mm, 20 mm, 40 mm, 100 mm, 200 mm or smaller or intermediate or larger dimension.

Down Conversion

While FIGS. 1-4 have focused on up-conversion, in some embodiments the techniques described herein are used for what may be termed "down conversion" (not necessarily from source wavelength, but from heat of body), where curve 112 is at or to the left of peak 108 and emission is at wavelengths longer than the peak of curve 112. This has some potential advantages, for example, prevention of overheating of transparent substances and/or for conversion of (very high) thermal/solar radiation to electricity, and/or generation of energy at easy to use wavelengths, for example, as described below, e.g., for efficient photo conversion or for lasing.

Figure 5:
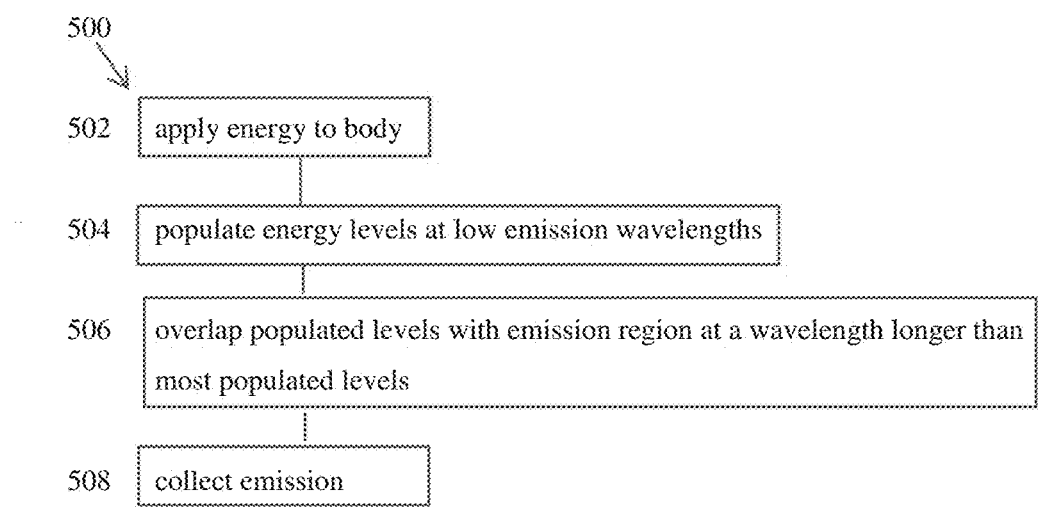

Referring specifically to flowchart 500 in FIG. 5, at 502, energy is applied to body 304, for example as described above.

At 504, low emission wavelengths are populated by the energy application.

At 506, also energy levels that overlap with the emission peak are populated.

At 508 emission is provided and collected and/or otherwise utilized.

Exemplary Solar and/or Entropy Pumped Laser

Figure 6A:
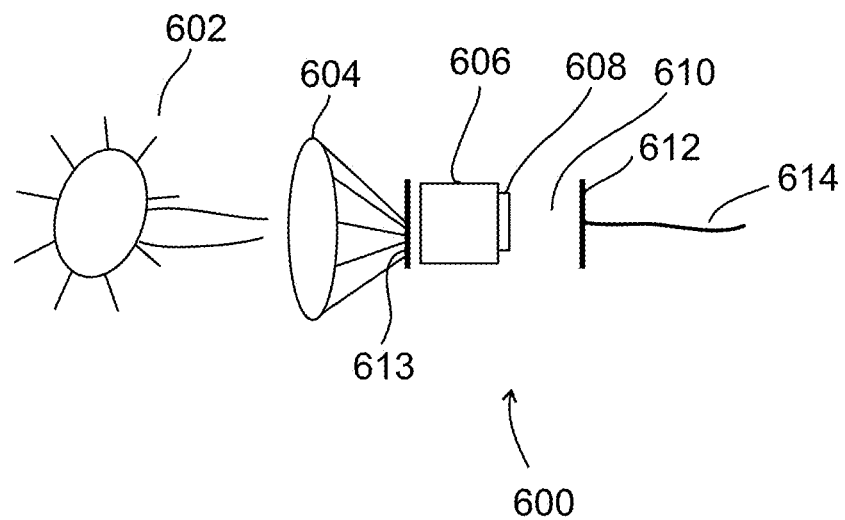

FIG. 6A is a schematic block diagram of a solar-pumped laser 600 in accordance with an exemplary embodiment of the invention.

Solar radiation from a sun 602 is optionally concentrated on a body 606 with a dopant layer 608, for example as described above. A resonant cavity 610 is optionally provided by a fully reflecting mirror 613 and a partially reflecting mirror 612. Laser light 614 is then emitted from mirror 612.

In an exemplary embodiment of the invention, body 606 is adapted for use with solar radiation. In one example, body 606 is adapted to absorb visible radiation (e.g., possibly at shorter wavelength than the emitted wavelength) and convert the absorbed radiation to heat or polariton states. In one example, absorbers at solar (e.g., visible) wavelengths are added to body 606. This can be used to heat body 606 to a black body temperature which overlaps most of its radiative energy with the low emissivity region of body 606.

In an alternative design, heat is used instead of sun 602 or the CO2 laser described below.

As a generalized description of a pumped system, in an exemplary embodiment of the invention, body 606 is formed of a substrate which has a transparent wavelength range. At the (longer wavelength) end of the transparent window the pump can be absorbed. The pump may include, for example, solar radiation, laser emission, thermal source or any other excitation/heat source. The heating source is optionally used to heat body 606 to a temperature where its black body emission is arrested in the transparent window. That is black body emission is defined uniquely by the Temperature, but due to the transparent window and thus the low emissivity, minimal radiation will drain out from the device. Adding an emitter at 1 micron (or at a different desired wavelength) will drain the thermal (or other) excitation because of the high emissivity of the emitter, optionally with the help of cavity 610 which enhances the emitter emission due to Purcell effect, and thus enhance the conversion efficiency. Optionally, the ratio between the emissivity of the substrate and the emitter at the wavelength of the black body relevant wavelengths set the conversion efficiency. In an experiment described below, Silica is used as a substrate and Ytterbium as an emitter.

As noted, an additional absorber at shorter wavelengths than the emitter may be added to the device in order to collect heat from the visible spectrum such as to convert visible solar radiation to heat. In an exemplary embodiment of the invention, it is desired to limit the transparency above the substrate transparency at the transparent window. Such absorbers can be metal nano-particles, quantum dots, rare earths, transition metals, and other materials. The high transparency at the transparent window usually demands that the pump absorption at the visible spectrum is low. This can be overcome by a cavity design for the visible spectrum, which enhances the propagation distance of the pump at the device.

Figure 6B:
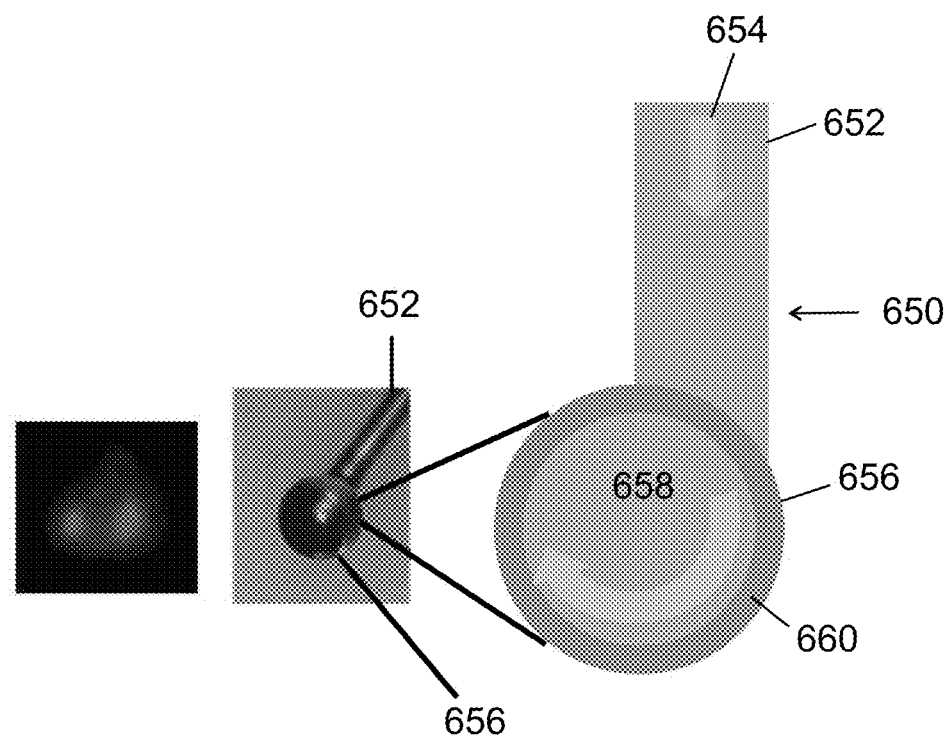

FIG. 6B is a schematic showing of a solar-pumped laser in accordance with an exemplary embodiment of the invention. A fiber 652 collects light 654 (e.g., solar radiation collected via forest of fiber tips). Light 654 circulates in a volume 658 of a cavity 656 (e.g., a sphere) having a resonant surface 660. Optionally, cavity 658 includes light absorbing materials converting visible wavelengths to heat, to be used as described herein.

Exemplary PV Upconverter

As a variation on a solar pumped laser, apparatus in accordance with an exemplary embodiment of the invention can be used to convert heat and light into radiation suitable for a photovoltaic (PV) converter and thereby electricity.

FIG. 7 is a schematic block diagram of an energy upconverter 700 including with a PV converter 714, in accordance with an exemplary embodiment of the invention.

Light from a sun 702 is optionally focused optics 704 on a body 706. As shown, body 706 is enclosed in cavity formed by reflectors 710 and includes, for example, a doped high emission area 708 (or all of body 706 may be so emitting).

Body 706 is heated as described above and emits radiation at the high emissivity window of dopant 708, which, due to optional cavity 710, causes the emission of laser radiation. Such radiation is optionally collected by a PV converter 714 which is optimized for conversion at the wavelength of the laser radiation.

In an exemplary embodiment of the invention, the process may be described as follows. Body 706 is configured to absorb of thermal radiation at a high emissivity region in the Near IR range. This causes heating of body 706 the cavity to a temperature associated with black body emission at the transparent region (in order to reduce losses). The thermal energy is emitted by an emitter matched to a band-gap of a photovoltaic cell (e.g., Silicon about 1 eV) via photoluminescence or lasing. Optionally, the photovoltaic cell is placed around the cavity (e.g., on all sides) to convert the band-gap emission into electricity.

In an exemplary embodiment of the invention, the optimized conversion wavelength is at about 1 micron.

It should be noted that the thermodynamic limit for the efficiency of single junction photovoltaic cells is at ~30%. The state of the art Si cells reach 24% efficiency. Theoretically, maximal efficiency approaches unity could be achieved if the sun's light was harvested by an optical system that could emit it as monochromatic light at 1 micron, where Si PV have efficiency approaching unity. In an exemplary embodiment of the invention, this is provided or approached by the design described herein.

Referring to the experiment described below, the CO2 pump, is replaced with solar radiation at the range between 2.4 micron and 10 micron where SiO2 absorbs. Adding absorbing materials such as metal nano-particles to absorb the visible spectrum can be used to enhance the power conversion as long as these materials are as transparent as SiO2 above 1 micron. It is noted that the converted wavelengths may be shorter than the emitted wavelengths.

The SiO2 can be replaced with many transparent materials. One recipe for choosing a material is the requirement for a wide optical window where the material is transparent (e.g., as SiO2 is transparent between 0.4 and 2.4 microns). Optionally or alternatively, the Ytterbium can be replaced with other photoluminescence and/or phosphorescence materials depending on the desired wavelength to match the specific solar cell. For a silicon solar cell Neodymium can replace the Ytterbium, while for CIGS an Europium emitter may be preferred.

Exemplary Solar Storage System

Figure 8:
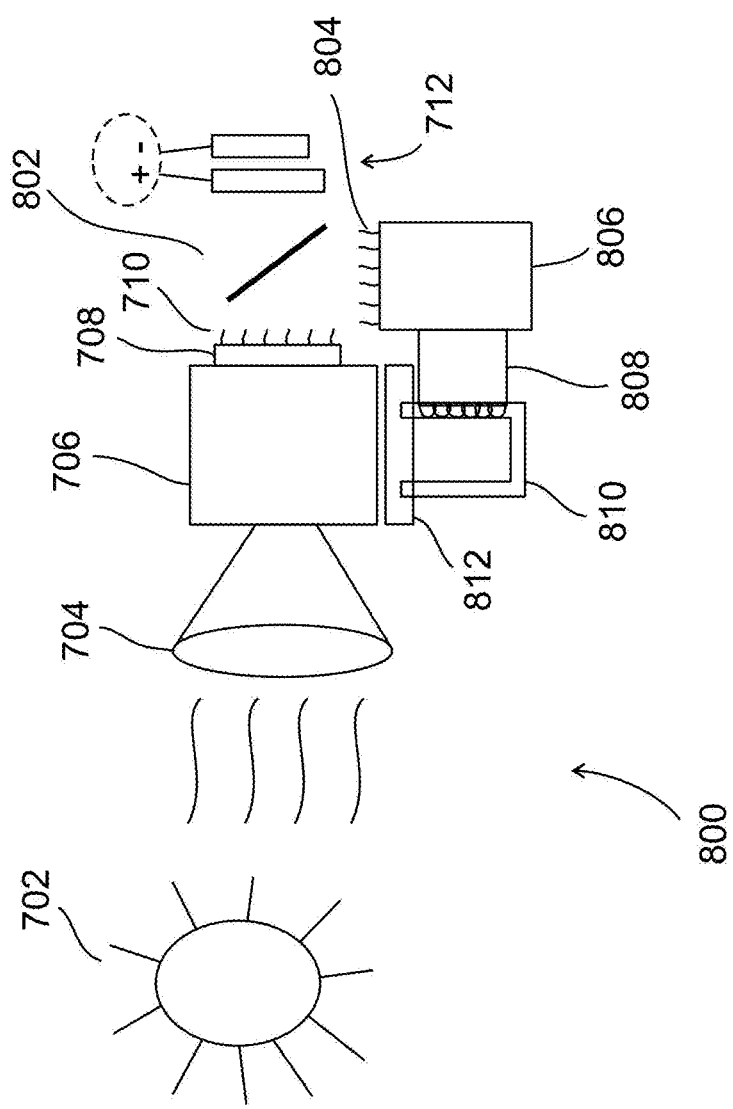

FIG. 8 is a schematic block diagram of a solar storage system 800, in accordance with an exemplary embodiment of the invention.

A potential advantage of some embodiments of the invention is that high energy illumination can be provided by the methods described herein. Optionally, this is used for generating storage energy, for use, for example, at night or at other times with lower solar flux. Another potential advantage of some embodiments of the invention is that heat can be used to power a conversion process as described herein. System 800 shows both of these potential advantages by both using part of the solar radiation to create stored energy and by using that stored energy to generate electricity using the same process as described herein, thus potentially reducing material costs by reusing a same element both for solar conversion and for heat conversion.

Referring to FIG. 8, light from sun 702 is focused using optional optics 704 onto a body 706 (optionally insulated and/or in a cavity. Emissions 710 are produced from an emitter 708 (separate or dispersed in body 706. A splitter 802, for example, a partially reflecting mirror, sends some emission radiation to a PV converter 712, which may be connected to a load (or for some other use of the radiation). Other radiation, 804, at a ratio or amplitude optionally controlled by a controller (not shown) impinges on a reactor 806 which stores the energy, for example, in chemical or mechanical form. When needed, reactor 806 (or a separate reactor) converts some of said stored energy back into heat, which may be conveyed back to body 706 by a thermal contact 812. Optionally, a heat conveying system 808, 810 uses a first fluid which circulates inside reactor 806 and a second fluid which circulates in thermal contact 812, to exchange heat. Alternatively, radiation or other thermal conveying means may be used.

In a first type of conversion, the high energy emissions 804 are converted into chemical energy by the employment of a high temperature endothermic thermo-chemical response in oxides. This includes reactions such as the MgO—Mg redox reaction, where MgO is reduced at high temperatures to Mg, which is oxidized again by water to produce $H_2$ gas fuel. High heat is optionally provided by concentrating emissions 804. In an alternative reaction, emissions 804 store energy by bond breaking, for example, splitting water, or splitting Ammonia splitting to Nitrogen and Hydrogen (or splitting a mixture of ammonia and water). In a further alternative reaction, emissions 804 are used to make high temperature.

As noted with respect to the results of the experiment below, the output luminescence shows that energetic photons are promoted as if ultra-high surface temperatures were provided. This can be used to derive such thermo-chemical reactions. Optionally, absorption at visible light wavelength is enhanced as described above or using transition metals. Optionally, the chemical reactants (e.g., the oxides) are provided in place of the emitter.

In an exemplary embodiment of the invention, the effective temperature is increased by using Europium as an emitter.

Example Implementations

The additional exemplary implementations described below provide example embodiments of the invention, and serve not only to limit but also to broaden the scope of the above description.

Another example embodiment is a system which includes two conjugated active band gap materials.

A first material is a fluorescent absorber/emitter of a band-gap named herein $Eg_1$. The first material may optionally include a band-gap material such as Quantum Dots (QD), rare earths and direct band-gap semiconductors such as GaAs, InGa, as well as other materials, such as, for example, included in FIG. 4. The first material is optionally heated by solar radiation, and/or by some other heat source.

Radiation from the first material then optionally illuminates a solar cell which includes a second material having a band-gap named herein $Eg_2$, where $Eg_2 > Eg_1$. Temperature of the second material is optionally maintained at room temperature.

The second material can be silicon and amorphous silicon with various dopings as well as other materials, such as, for example, included in FIG. 4, where Eg2>Eg1.

At high quantum efficiency, meaning also low non-radiative losses, for nearly each solar-photon absorbed by the first material a photon is emitted, which encapsulates thermal energy and $Eg_1$. Each emitted photon potentially has an average energy of $Eg_1 + 3KbT_1$, where $T_1$ is a temperature of the emitter and Kb is the Boltzmann constant. The photons are absorbed by the solar cell of the second material when $Eg_2 < Eg_1 + 3KbT_1$. Since $Eg_2 > Eg_1$, the voltage over the solar cell is greater than that which is expected of a single solar cell configuration at room temperature, and energy harvested by the above-described system is greater. The above-described system is an example embodiment of up-conversion of thermal radiation.

Reference is now made to FIG. 15A, which is a simplified illustration of an example embodiment 1500 of the invention.

FIG. 15A depicts light 1501, such as, by way of a non-limiting example sunlight, falling upon a first material 1503, which is optionally a fluorescent absorber/emitter of a band-gap $Eg_1$ as described above.

In some embodiments the light 1501 is optionally concentrated by a lens 1502 onto the first material 1503.

The first material 1503 emits radiation 1505 onto a second material 1507, such as the second material having a band-gap $Eg_2$ described above.

In some embodiments, a gap 1506 exists between the first material 1503 and the second material 1507.

In some embodiments, the gap 1506 is in a vacuum.

In some embodiments, the second material 1507 includes a back reflector 1509, which potentially reflects radiation which may pass through the second material 1507 and potentially enables more of the radiation to be absorbed by the second material 1507.

In some embodiments the second material 1507 is equivalent to a solar cell collector, and produces a voltage V 1511 across the solar cell, or, in other terms, produces a current J 1513.

In some embodiments sub band-gap photons, having an energy $E_{ph} < Eg_2$, are optionally reflected back towards the first material 1503, potentially maintaining a high temperature through the back reflector 1509.

In general terms, the embodiment depicted in FIG. 15A potentially enables harvesting radiation such as solar radiation, and collecting more photons from a lower wavelength range than presently used in solar cells, thereby potentially producing more electric carriers, and producing more current. The embodiment depicted in FIG. 15A potentially produces electric carriers in a quantity typical of the second material, which in some embodiments harvests lower wavelength, and at the same time, the embodiment of FIG. 15A produces a voltage typical of the first material, which produces a higher voltage than the second material due to its larger band-gap.

For example, solar cells are limited at approximately 32% efficiency for most single band-gap materials, such as silicon, at room temperature.

The example embodiment depicted in FIG. 15A is calculated to potentially operate at an efficiency above 32%, and even above 40%.

Reference is now made to FIG. 15B, which is a simplified schematic illustration showing an energy diagram 1529 up-conversion in accordance with an exemplary embodiment of the invention.

The energy diagram 1529 depicts energy increasing along a vertical direction, and depicts a first region 1531 which corresponds to the first material of FIG. 15A and a second region which corresponds to the second material of FIG. 15A.

The energy diagram 1529 of FIG. 15B is qualitative, not quantitative, and not necessarily drawn to scale.

FIG. 15B depicts an arrow which represents radiation 1530 falling onto a first material having a first band-gap $Eg_1$.

An arrow 1541 represents an excitation from below the band-gap Eg1 to above the band-gap $Eg_1$, and another arrow 1542 represents the excitation joining an energy distribution associated with a thermal distribution corresponding to a temperature $T_1$ in the first material. Another depiction of the energy levels in the first material, not necessarily to scale, is a depiction of a lower Fermi level 1536 of a population of holes, and a higher Fermi level 1537 of an excited electron population. A gap between the lower Fermi level 1536 and the higher Fermi level 1537 is related to the amount of energy which may be produced from the excitation of the electron population in the first material. The amount of energy which may be produced from the excitation of the electron population in the first material depends on the first material, on the illumination rate and on the absorption of the second material.

The first material radiates a portion of its energy toward the second material, as represented by an arrow 1543, and another arrow 1544 represents absorbed energy in the second material joining an energy distribution associated with a thermal distribution corresponding to a temperature $T_2$ in the second material. Another depiction of the energy levels in the second material, not necessarily to scale, is a depiction of a lower Fermi level 1538 of a population of holes, and a higher Fermi level 1539 of an excited electron population. A gap between the lower Fermi level 1538 and the higher Fermi level 1539 is related to the amount of energy which may be produced from the excitation of the electron population in the second material. The amount of energy which may be produced from the excitation of the electron population in the second material depends on the second material, on the radiation rate and from the first material to the second material and on the absorption of the second material.

In an example embodiment, such as the example embodiment of FIG. 15B, the temperature $T_2$ is 300K, which is approximately room temperature, which potentially does not require cooling, and is a temperature at which a solar cell is efficient. As depicted by an arrow 1545, radiation from first material which is not absorbed at the second material, and possible radiation from the second material to the first material are optionally reflected to the first material. Optionally the reflection is done by a mirror placed at a back side of the second material (not shown in FIG. 15B, but depicted as optional back reflector 1509).

The second material acts as a solar collector, as described above with reference to FIG. 15A, and produces a voltage $Voc=\mu_2$ 1535 which is associated with the second material, which received energy from the first material.

Some radiation 1545 is radiated from the first material to the second material at energy levels which are not absorbed by the second material. At least some of such radiation 1545 is optionally reflected to the first material by the optional back reflector 1509 depicted in FIG. 15A.

Exemplary Laser Up-Converter

Figure 9:
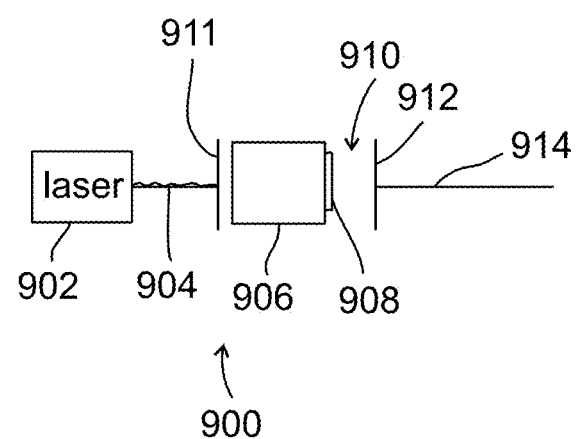

FIG. 9 is a schematic block diagram of a short wavelength laser source 900, in accordance with an exemplary embodiment of the invention. In source 900, longer wavelengths, optionally coherent, are used to drive a lasing effect with a high efficiency, for example, above 10% or 20%.

A laser source 902 illuminates a body 906 held in a cavity 910 (or forming one), having, for example, a fully reflecting mirror 911 (which is optionally transparent at the wavelength of source 902) and a partially reflecting mirror 912. A dopant 908, optionally provided as a layer, acts as an emitter. When stimulated, body 906 transfers energy to energy states which overlap with emission of emitter 908, generating a laser illumination 914.

In an exemplary embodiment of the invention, the absorber (e.g., an added dopant) is matched to source 902. An emitter is optionally matched to the desired wavelength of laser illumination 914. The material of body 906 is optionally selected so as to be transparent at wavelengths below that of emitter 908 in a region wide enough to allow non-radiating energy states to store the incoming energy.

In an exemplary embodiment of the invention, the emitter is a known UV emitters. The phosphor typically used for a near 368 to 371 nanometer emission peak is either europium-doped strontium fluoroborate ($SrB_4O_7F:Eu^{2+}$) or europium-doped strontium borate ($SrB_4O_7:Eu^{2+}$), whereas the phosphor used to produce a peak around 350 to 353 nm is lead-doped barium silicate ($BaSi_2O_5:Pb^+$). Also mercury can be modified to produce a UVA, UVB emission.

In an exemplary embodiment of the invention, the SiO2 used in some embodiments of the invention is replaced by a UV transparent glass/crystal to support lasing in the UV.

In a conventional x-ray tube, X-rays are generated by accelerating electrons released by a hot cathode to collide with a metal target, the anode, creating the X-rays. In an exemplary embodiment of the invention, the hot cathode is replaced by an effective high temperature excitation as described herein (using an optically pumped electrode emitter and/or by placing an electron emitter on the emitter and/or using the high effective optical emission to heat an electron source). Optionally, the heat causes the electrons to accelerate so that when they hit a target (e.g., tungsten, optionally at a positive voltage), x-rays are emitted. Optionally, a system as described in U.S. Pat. No. 6,463,124, for converting laser light to x-ray radiation, is used.

High Temperature Chemistry

As noted above with respect to storage, the emitted illumination indicates effective high temperature, which may be used for chemical reactions. In one example, a chemical reactant or reactor is coupled to body 304 and/or to the emission radiation and uses this radiation to drive a reaction, such as bond splitting. In an exemplary embodiment of the invention, the emission radiation is selected to match a desired energy for bond breaking and/or ionization and/or for other photo-chemical and/or high temperature processes. Optionally or alternatively, the emission illumination is focused as used as a heat source.

Chemical reactants may be provided and results carried away using flow systems as known in the art of photochemistry and chemical engineering, for example.

In an exemplary embodiment of the invention, a chemical process includes, heating a body (or a cavity enclosing the body and/or formed thereof) to a temperature associated with black body emission at a transparent region of the body (in order to reduce losses) by means of thermal radiation or laser radiation. Then emitting the thermal energy using an emitter matched to a desired chemical process. Following this, or previously or simultaneously, an ingredient of the chemical process is placed in the vicinity of the lasing mode. Then, allowing the effective high temperature of the lasing mode to induce a relevant high temperature chemical process. At this time, the cavity can remain at low temperature as the average temperature of all the modes in the body and/or cavity is low.

It is expected that during the life of a patent maturing from this application many relevant emitters and absorbers will be developed and the scope of these terms is intended to include all such new technologies a priori.

As used herein the term "about" refers to ±10%.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following experiments.

Some Experiments and Exemplary Implementations

Reference is now made to the following experimental setup in which several experiments were carried out and which together with the above descriptions illustrate some embodiments of the invention in a non limiting fashion.

Referring now to FIGS. 10A-10D which describe an experimental set up. Specifically, FIG. 10A shows the experimental setup, FIG. 10B shows a bare cavity picture, and FIG. 10C shows the emission of the cavity's whispering gallery lasing mode. FIG. 10D is a schematic showing of a cavity mounted on a fiber as used in some experiments and as may be practiced in some embodiments of the invention (e.g., using a fiber transparent both to the excitation radiation and the emission radiation). In some embodiments, the cavity is directly stimulated, while the fiber is used to provide an incoming signal to be amplified and an outgoing signal. In the particular experiment carried out, a fiber as shown in FIG. 10D was used only for mounting, with both excitation and emission being freespace.

In an exemplary implementation, a commercial, 125 micron diameter, $SiO_2$ fiber tip was melted to form spherical cavities at diameters between 300 micron and 500 micron. The cavities were dipped in $Yb_2O_3$ micro crystals powder and melted again to form bodies 1004. A 2 W $CO_2$ laser beam at 10.6 micron from a source 1002 was focused on the resonator inside an integrating sphere. Resonator emission between 400 nm and 11 micron were detected by a spectrograph 1008 and calibrated against a black body source 1010 at 1437 kelvin, which also was focused onto the integrating sphere, for calibration purposes.

FIGS. 11A and 11B show experimental measurements. FIG. 11A shows the emission through the entire near and mid IR range of a bare resonator and a $Yb_2O_3$ doped resonator as well as emission of a black body at 1473 kelvin normalized to the sphere dimensions. FIG. 11B shows a zoom in on the peak emission at 978 nm showing the power spectrum as function of the excitation power with a threshold characterization of the peak at 973 nm (FIG. 11B, insert).

The broad power spectrum of doped and bare cavities, is shown at FIG. 11A. The experimental results of the doped cavity show two interesting features. i. A sharp peak at 982 nm. ii. Emission between 3 micron and 5 micron which resembles a black body emission at 600 kelvin (inset). In a bare cavity the emission is between 2 micron and 4 micron resembles black body at 700 kelvin. Zooming in on the 982 peak at the doped cavity and monitoring its power spectrum for various excitation power levels (FIG. 11B) shows broad photoluminescence emission at excitation below 0.8 W. At higher excitations, a sharp peak appears, rising much faster than the photoluminescence emission. Monitoring the peak power spectrum, at 982 nm, as a function of excitation power shows a clear threshold characterization (FIG. 11B, insert), which indicates lasing behavior. As the excitation power increases more peaks appear suggesting multi-modal lasing phenomena.

It is important to note that throughout the many excitation measurements the cavities remain stable with no evidence of melting or changing of their spectral response, this strongly suggests that the cavities, including their surfaces, did not melt and that the "real" temperature of the cavity and/or its surface was not at the emission "temperature".

Another interesting result is that experiments using $YbO_2$ without SiO2 do not show strong emission at similar excitation levels. At very high excitation when the temperature reaches 1800 Kelvin $YbO_2$ emission is known to be characterized by a typical black body shape with an additional peak at 980 nm.

Another interesting result is the effect of removing the cavity structure. $YbO_2$ doped SiO2 without cavity structure emits very weakly, which suggests that the use of a cavity for providing resonance may be important to enhance lasing effect or even to enhance emission efficiency. Possibly, the use of a cavity enhances emission by a factor of, for example, 2, 10, 50, 100 or greater or intermediate factors.

According to measurements made, approximately 20% of the emitted photons were consistent with the high-emissivity window and 80% with black body radiation. Due to thermal losses, the total conversion efficiency appears to be about 5%, for a non-insulated system.

Various variations were tried out, including using either Ytterbium or Erbium as emitter (both worked), various power levels (levels as low as 0.8 W CO2 beam power worked). In another experiment, indirect heating of the cavity as a bulk did not result in laser emission. Possibly, if the wavelength of the heating were to match the surface phonon polaritons in the cavity, emission would have resulted. Optionally or alternatively, efficiency was lower and results not detected and/or losses too high. In another embodiment, using solar radiation allows a coupling to surface phonons, as possible, for example, using a CO2 laser. In an exemplary embodiment of the invention, heating wavelengths are selected to match surface characteristics (e.g., phonons) of the cavity rather than volume.

FIG. 10D shows a cavity 1022 mounted on a fiber 1020. In the experiments, the fiber served only as a mechanical support, but in other embodiments, it may serve as follows. Incoming radiation 1024 arrives along fiber 1020. This radiation is coupled to cavity 1022 at a point 1026 thereof. A resonance ring 1028 forms on a surface of the cavity, as shown and emitted radiation 1030 exits along the fiber. Absent such an exit mechanism, emission may occur in a plane which includes ring 1028. Optionally, fiber 1020 is selected to be transparent both to exciting and to emitted radiation. In an alternative embodiment emission is enhanced by providing an imperfection or a grating on ring 1028. Optionally or alternatively, doping is provided only on part of ring 1028, rather than on all of cavity 1022.

Additional Experiments and Exemplary Implementations

The additional experiments and exemplary implementations described below provide example embodiments of the invention, and serve not only to limit but also to broaden the scope of the above description.

An entropy-driven tenfold up-conversion, from mid to near-infrared, at efficiency above 10% is experimentally demonstrated. This enables novel uses of thermal radiation.

Introduction

Frequency up-conversion of low-energy photons into a high-energy photon, greatly contributes to imaging, light sources, detection and other fields of research. However, to date, frequency up-conversion offered negligible efficiency when up-converting many photons. Thermodynamically, conventional incoherent up-conversion is driven by an internal energy of incoming photons. However, a system can also drive work through change in its collective properties, such as entropy. In the example implementation described below, an entropy-driven ten-fold up-conversion from 10.6μ to 1 μm at an internal efficiency above 27% and at a total efficiency above 10% is experimentally demonstrated. In addition, the emitted radiance at 1 μm exceeds the Black-Body radiance of our device as expected according to its bulk temperature, indicating an emitter's effective-temperature which is considerably above the bulk-temperature. This example implementation opens the door for up-conversion of thermal-radiation, and high-temperature chemistry done at room-temperature.

Traditional frequency up-conversion effects include coherent (second, third and parametric up-conversion and incoherent (two photon and multi-photon absorption) processes, yet they all offer negligible efficiency when converting many (by way of a non-limiting example ~10) photons into a single high-energy photon.

Some reasons for such low efficiency:

i. A large frequency difference between the pump and the produced photon induces a large momentum mismatch, making phase-matching extremely challenging, while without phase-matching the nonlinear parametric up-conversion process becomes highly inefficient.

ii. The nonlinear medium should be transparent at these two very different frequencies.

iii. The high-order nonlinear optical susceptibility involved in a ten-fold up-conversion process is very weak, and requires long propagation distances, beyond the limit set by transparency and phase matching considerations.

iv. The probability for simultaneous multi-photon interaction requires huge intensities.

The above-mentioned problems are actually magnified when the radiation source is incoherent. For these reasons, the record efficiency of tenfold up-conversion to date is lower than 0.01%, which was achieved under pulse excitation at intensities of $10^{15}$ W/cm; many orders of magnitude higher than currently available continuous wave [CW] sources.

To find efficient up-conversion mechanisms for partially-incoherent light, the work involved in the process of photon emission is compared to the work performed by a thermodynamic system. Here, the potential energy of each photon is defined by its chemical potential, μ. In such a view, absorption of an energetic photon followed by emission of a red shifted photon while releasing heat to the environment acts as an "optical heat pump" driven by a difference in the chemical potentials of the photons. This description is general to many light sources, and also includes the absorption of two or more pump photons to generate a single high energy photon (with lower chemical potential than the sum of the pump photons). However, in addition to this mechanism, which is energetically balanced at the single excitation-emission level, collective properties of the system can also drive work. The amount of work a system can produce is limited by the change in its Gibbs free energy, G: dG=d[PV−TS+ΣμN]. Here P, V, T and S are collective properties of the system: P is pressure, V is volume, T is temperature, S is the entropy which is proportional to the number of populated states in the system, and ΣμN is the sum of the chemicals potentials.

In many optical systems P and V are constant, thus the change in PV can be excluded from generating work. An exception to this general rule is the phenomenon of Sonoluminescence, where UV emission is generated as sound is converted into light through a drastic change in PV.

To the best of the inventors' knowledge, the change in the temperature and entropy of a system, TS, has never been used for frequency up-conversion. Below it is shown how to utilize the change in TS for an efficient tenfold frequency up-conversion.

For lasers, entropy relates to the spatial and temporal coherences. As the entropy is lower, the laser coherence is higher and the Gibbs free energy is higher, allowing higher light concentration. Such a radiation source has a high "Brightness-temperature", which is defined as radiance in a specific wavelength which is equal to a Black-Body radiance at the same temperature and the same wavelength. The term radiance refers to the amount of radiation power per wavelength per solid-angle per area. Such a high brightness-temperature radiation, if absorbed under perfect conditions, can equate a target's temperature to the brightness-temperature.

A thought experiment involving this concept is a use of a laser to heat a highly emissive body in order to increase its temperature, thereby enhancing its Black-Body radiation. Consider for example, a single-mode $CO_2$ laser at 100 W of optical power heating a thermally-insulated emissive body to the temperature of the sun (5800K), resulting in thermal radiation similar to solar radiance. In such a temperature, most of the generated photons are in the visible and near-infrared wavelength range, which have more than tenfold enhancement in internal-energy compared to the pump $CO_2$ photons at 10.6μ wavelength. However, although this concept can be highly efficient up-conversion mechanism, it is challenging to realize because there are no materials that remain stable at the temperature of the sun. Also, the broad thermal emission of black body radiation is less attractive for many applications, such as communication and detection where information is frequency-dependent. A much better device should operate at a reasonable temperature, for example room temperature, and preferably emit spectrally narrow up-converted light.

An example embodiment uses a high brightness-temperature source, such as a laser, to excite only specific modes to a high effective-temperature, while the bulk remains at a relatively low temperature. Although under such non-equilibrium conditions the term temperature is not well defined, "Effective-temperature" describes a population of a specific phonon-mode which corresponds to Boltzmann's thermal population at that temperature. An emitter which is coupled to these excited modes, shares their effective-temperature, and emits a spectrally narrow radiation at a high brightness-temperature, considerably higher than its bulk temperature. Thus far, utilizing such ideas for frequency conversion have not been explored.

In photoluminescence, the absorption of an energetic photon is followed by heat dissipation, and emitting of a Stocks shifted photon. A reduction in internal-energy between the absorbed and emitted photos corresponds to the change in Gibbs free energy that drives the process. In the example embodiment described herein the high internal-energy of the incoming photon is replaced with high free-energy of the incoming photons, embedded in their entropy (high Brightness temperature) rather than their internal-energy. This allows a spontaneous process, a reduction in free-energy, to support up-conversion.

Reference is now made to FIG. 12, which is a simplified illustration of a free energy diagram of a frequency up-conversion process according to an example embodiment of the invention.

FIG. 12 depicts free-energy flow in the process of the example embodiment described herein, as conventionally sketched for a photon internal-energy flow in photoluminescence.

To experimentally demonstrate the concept illustrated by FIG. 12, $Yb_2O_3$ doped $SiO_2$ spherical cavities were produced at diameters between 30μ and 300μ. A CW $CO_2$ laser beam at 10.6μ wavelength is focused, at power levels lower than 1 W, onto a spherical resonator within an integrating sphere. The resonator emission between 0.4μ and 11μ wavelength is detected by a spectrograph and calibrated against a Black-Body source at 1200 C (see a description of methods in a section titled "Methods" below).

Reference is now made to FIGS. 13A-13C, which are simplified illustrations of the experimental setup used in the additional example embodiment of the invention.

FIG. 13A depicts the experimental setup.

FIG. 13B depicts a picture of the spherical cavity. Such a cavity, when un-doped, supports whispering-gallery modes [WGMs] with Q-factors exceeding $10^7$.

FIG. 13C depicts a simulation of the first mode of the spherical cavity using a finite element method simulation.

FIGS. 13A to 13C are similar to FIGS. 10A-10C described above, but FIG. 13C specifically depicts the simulation of the first mode of the spherical cavity of the example implementation described herein.

The resonator's radiance is measured at the near-infrared [NIR] under excitation of 684 mW. The emission image is captured using a Si CCD camera, (detecting wavelengths shorter than 1.10 in order to gain information about the spatial distribution of the radiation, which is used for calculating the radiance.

The power spectrum at the NIR region is measured using the calibrated integrating sphere. Normalizing the power spectrum with the emission area gives a minimal value for isotropic radiance. The measured radiance is compared with the Black-Body and $Yb_2O_3$ radiances at 1650 C, which is the melting point of $SiO_2$, hence serving as an upper limit for the device stability.

Results:

Reference is now made to FIGS. 14A-14D, which illustrate experimental results obtained with example embodiments of the invention.

FIGS. 14A-14D summarize typical results of many experiments done with over 20 different resonators.

Figure 14D:
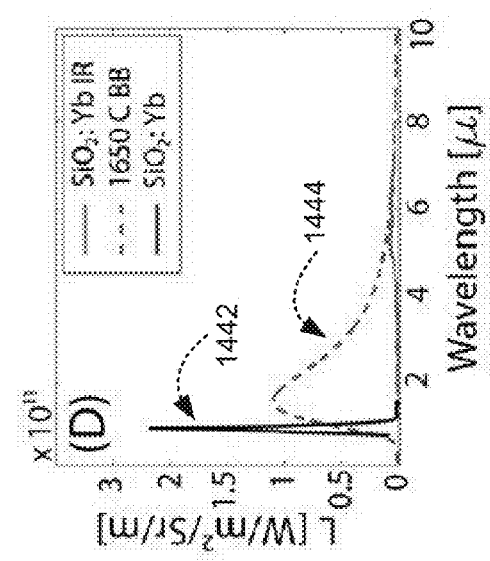
Figure 14C:
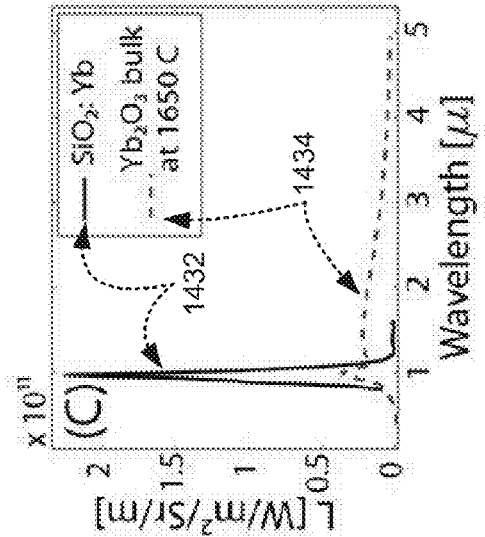
Figure 14B:
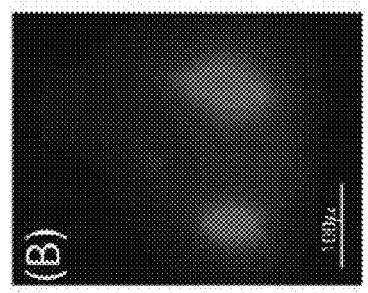
Figure 14A:
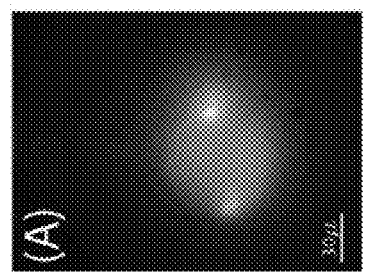

FIG. 14A depicts CCD imaging of a single mode emission.

FIG. 14B depicts CCD imaging of a multimode emission.

FIG. 14C depicts radiance of a device manufactured and operative according to the example embodiment versus $Yb_2O_3$ radiance at 1650 C.

FIG. 14D depicts radiance of a device manufactured and operative according to the example embodiment versus black body radiance at 1650 C.

FIGS. 14A and 14B depict captured emission up to 1.1 μm wavelength. The emission appears as a spatial distribution of WGMs with the highest Q-factor. In FIG. 14A the emission corresponds to the first mode, similar to the simulation results depicted in FIG. 13C.

FIG. 14B depicts emission from the first few modes.

FIG. 14C compares the radiance of the resonator of FIG. 14B) with the radiance of bulk $Yb_2O_3$ at 1650 C. As can be seen, the resonator emission has a sharp peak at 980 nm (black solid line 1432), which can be attributed to Ytterbium emission. This sharp peak is very different than the emission of bulk $Yb_2O_3$ under thermodynamic equilibrium, where most of its energy is in the thermal region of the spectrum, at wavelengths longer than 1μ (blue dotted line 1434 of FIG. 14C). The emission resembles photoluminescence of Ytterbium pumped by energetic photons.

FIG. 14D depicts emission measurements in the IR-region, showing residual radiation beyond 2.4μ wavelength. Comparing these results with Black-Body radiance at 1650 C reveals that the 980 nm peak radiance is four times that of a Black-Body radiance at the maximum possible device temperature (black line 1442 and dotted red line 1444 of FIG. 14D).

Furthermore, the emission at 980 nm contains 27% of the total emission power, and 1% of the total input power deposited into the system. Such efficiency is many orders of magnitude better than any existing art the inventors are aware of. In fact, more than an order of magnitude enhancement in Ytterbium emission under partial pressure of 300 mbar, measured through a vacuum chamber window is observed. This indicates a total conversion efficiency in excess of 10%.

Discussion:

Some evidence for high effective-temperature of the $Yb_2O_3$ is now described:

i. At the infra-red wavelength (5μ-10μ) where silica is highly emissive, its thermal emission fits a Black-Body radiation at just below melting temperature, 1650 C. This evidence reflects a true temperature of the resonator near thermodynamic equilibrium, also evident by the stability of the device, which does not melt.

ii. At this temperature, in thermodynamic equilibrium, most of the thermal energy is at wavelengths longer than 1 μm. This doesn't appear in the example embodiment described above. The emission exhibits a sharp single peak.

iii. The radiance of the $Yb_2O_3$ is four times the Black Body radiance at 1650 C, which is the maximal possible radiance under thermodynamic equilibrium.

Without being limited to theory, the above three observations may be proof that $Yb_2O_3$ is at a considerably higher Brightness-temperature than the bulk.

Some conditions which are suggested in order to reach high $Yb_2O_3$ brightness-temperature:

i. Pump source at high brightness-temperature. This condition is easily matched, by way of a non-limiting example, with a $CO_2$ laser, optionally operating at a single (or few) emission modes, at a brightness-temperature in the order of $10^{10}$ C.

ii. The excitation rate to a set of modes preferably exceeds their dumping rate to other modes; This condition can be met by, for example, the high absorption cross-section of $SiO_2$, which absorbs the 10.6μ $CO_2$ laser radiation within a depth of less than a wavelength from the surface, possibly through its vibronic-states.

iii. The $Yb_2O_3$ is preferably efficiently coupled to vibronic-states. This condition is satisfied, by way of a non-limiting example, by rare-earths. Furthermore, $Yb_2O_3$ radiation is enhanced by Purcell's effect of the high-Q WGM.

In some embodiments described herein, the target for absorbing radiation and up-converting the radiation was placed under vacuum.

In some embodiments described herein, the target for absorbing radiation and up-converting the radiation was placed under partial vacuum, for example a partial pressure of 300 mBar as described above. In some embodiments the partial pressure values are 500 mBar and below.

The inventors believe that placing the target under vacuum or partial pressure possibly reduces energy loss from the target, such as thermal losses.

To summarize, the above example described a frequency up-conversion mechanism, and experimentally demonstrated an efficient tenfold frequency up-conversion driven by entropy.

The example potentially opens new directions in various fields.

In solar energy for example, an embodiment of the invention potentially opens efficient ways for up-converting sub-bandgap solar photons to wavelengths where photovoltaics are more efficient.

In another example, the possibility to excite modes to a very high effective-temperature while the bulk remains at low temperature enables "hot chemistry" carried out at much lower temperatures such as room temperature. Examples of hot chemistry include conversion of sunlight into stored chemical energy, by employing a high temperature endothermic thermo-chemical response such as MgO—Mg redox, which exhibits energy recovery above 42%.

Each of the above examples potentially revolutionizes the ability to harvest the sun's energy for humanity needs.

Methods:

1. Sample Preparation:

Commercial 125μ fibers (Thorlabs) were positioned in the focus of a 20 W $CO_2$ laser (Synrad). The fiber tip was melted and fed into the focal point until the formation of a sphere, as seen under a microscope. The Sphere was subsequently dip-coated in a methanol:$Yb_2O_3$ nano-crystal suspension (1 ml methanol:100 mg $Yb_2O_3$), and then melted again by a short laser exposure of about half a second to smooth the surface of the sphere. For smaller spheres fabrication, the fibers were etched in an HF solution until the desired diameter was reached, prior to the melting process.

2. Optical Measurements:

A sample's radiance was measured by placing the sample in a white integrating sphere (LabSphere) for the NIR range and in a self-designed gold coated sphere for the IR range. A CO2 laser (Access lasers) at various intensities with stability of 2% was focused onto the sample by a gold parabolic mirror and ZnSe lens. In addition, a 1200 C calibrated black-body source (CI-systems) was focused inside the sphere for calibration purposes. The luminescence signals were chopped by an optical chopper (Stanford Research Systems) and amplified by a lock-in amplifier (Stanford Research Systems), after passing through a spectrograph equipped with appropriate gratings for the different spectral ranges (Oriel Instruments). In the NIR region signals were measured by a Ge detector (Judson Technologies), and an InGaAs camera (Andor Technology). In the IR region between 2 μm and 10 μm, the signal was detected using InSb and MCT (InfraRed Associates) detectors.

For measurements under vacuum, samples were put in a Dewar with optical windows connected to a vacuum system. The laser was focused onto the sample through a ZnSe window. The luminescence signal was measured by imaging the sample through the Dewar window onto the spectrograph equipped with a spectroscopic InGaAs camera.

General

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method for using an energy conversion apparatus to convert incoming radiation to electrical energy comprising:
   accepting incoming radiation from a radiation source external to an energy conversion apparatus;
   heating a photoluminescent material to a temperature T, where $T > (Eg2-Eg1)/3Kb$ where Eg2 is a band-gap energy of a photovoltaic material, Eg1 is a band-gap energy of said photoluminescent material, and Kb is the Boltzmann constant;
   using insulation to maintain said temperature of said photoluminescent material;
   using said photoluminescent material to absorb a first photon from the incoming radiation;
   the absorbing the first photon and the heating causing said photoluminescent material to emit a second photon at a shorter wavelength than said first photon; and
   placing a photovoltaic cell comprising said photovoltaic material to absorb said second photon and generate electricity.

2. The method of claim 1, in which said heating said photoluminescent material comprises using the photoluminescent material to absorb radiation photons thereby to absorb heat.

3. The method of claim 2, in which said band-gap of said photovoltaic material for absorbing said radiation photons is larger than a band-gap of said photoluminescent material.

4. The method of claim 2 and further comprising using a first optical unit for concentrating said radiation photons on said photoluminescent material.

5. The method of claim 1 and further comprising using said photoluminescent material to absorb heat energy by convection.

6. The method of claim 2, in which using said photoluminescent material to absorb heat comprises using said photoluminescent material to absorb heat by absorbing heat radiation.

7. The method of claim 1 and further comprising using an optical element for coupling said photoluminescent radiation from said photoluminescent material to said photovoltaic material.

8. The method of claim 1, in which said photoluminescent material is absorptive at solar radiation wavelengths.

9. The method of claim 1 and further comprising providing a photon reflecting configuration to reflect stray radiation for reabsorbing by said photoluminescent material.

10. The method of claim 2 and further comprising using a light source coupled to provide said radiation photons to said photoluminescent material, at a wavelength longer than a wavelength corresponding to a band$_z$gap of said photovoltaic material.

11. The method of claim 1, comprising using as said photoluminescent material a material which comprises a dopant selected from a group consisting of:
quantum dots;
nano-particles;
gold nano-particles;
rare earths;
Ytterbium;
Neodymium;
Europium;
Erbium;
direct band-gap semiconductors;
InGa; and
CdTe.

12. The method of claim 1 in which:
said using said photoluminescent material to absorb a first photon comprises absorbing the first photon at a wavelength in a range between 0.5 to 1.5 microns; and
said causing said photoluminescent material to emit a second photon comprises emitting the second photon at a wavelength in a range approximately between 0.80 to 1.2 microns.

13. Apparatus for converting incoming radiation to electrical energy, comprising:
a photoluminescent material for:
absorbing heat and absorbing a first photon from incoming radiation;
combining energy of said first photon with energy of said heat; and
emitting a second photon at a shorter wavelength than said first photon;
a photovoltaic cell comprising photovoltaic material for absorbing said second photon and generating electricity; and
insulation placed between said photoluminescent material and said photovoltaic cell for maintaining temperature of said photoluminescent material,
wherein:
said apparatus is configured to expose said photoluminescent material to the incoming radiation at wavelengths corresponding to energies greater than a band-gap of said photovoltaic material, and
said photoluminescent material is selected to have a luminescence peak emission at a wavelength which matches absorption of said photovoltaic material.

14. The apparatus of claim 13 in which:
said photoluminescent material is selected to absorb said first photon at a wavelength in a range between 0.5 to 1.5 microns; and
said photoluminescent material is selected to emit said second photon at a wavelength in a range approximately between 0.80 to 1.2 microns.

15. The apparatus of claim 13, in which said absorbing heat comprises absorbing heat and radiation photons.

16. The apparatus of claim 15, in which a band-gap for absorbing radiation photons of said photovoltaic material is larger than a band-gap of said photoluminescent material.

17. The apparatus of claim 15, and further comprising a first optical element for concentrating said radiation photons on said photoluminescent material.

18. The apparatus of claim 13, wherein said photoluminescent material further comprises a contact location for absorbing convective heat energy.

19. The apparatus of claim 13, in which said photoluminescent material is configured to absorb heat by absorbing heat radiation.

20. The apparatus of claim 15 and further comprising an optical element for coupling said photoluminescent radiation to said photovoltaic cell.

21. The apparatus of claim 13, in which said photoluminescent material is absorptive at solar radiation wavelengths.

22. The apparatus of claim 13, in which said photoluminescent material is absorptive at a wavelength of light generated in a chemical reaction.

23. The apparatus of claim 13 and further comprising a photon reflecting configuration to reflect stray radiation for reabsorbing by said photoluminescent material.

24. The apparatus of claim 15 and further comprising a light source at a wavelength longer than a wavelength corresponding to a band-gap of a photovoltaic material comprised in said photovoltaic cell and coupled to provide said radiation photons to said photoluminescent material.

25. The apparatus of claim 13, in which said photoluminescent material is selected from a group consisting of:
quantum dots;
nano-particles;
gold nano-particles;
rare earths;
Ytterbium;
Neodymium;
Europium;
Erbium;
direct band-gap semiconductors;
InGa; and
CdTe.

26. The apparatus of claim 15, wherein said photoluminescent material is configured to absorb heat by absorbing said radiation photons.

27. The method of claim 1, in which said photoluminescent material emits photoluminescent radiation when said photoluminescent material is at a temperature above 600 Kelvin.

28. The apparatus of claim 13, in which said photoluminescent material is selected to emit photoluminescent radiation at a temperature above 600 Kelvin.

29. The apparatus of claim 13 in which said apparatus is configured with said photovoltaic cell placed behind said photoluminescent material relative to a direction of the incoming radiation.

30. The apparatus of claim 13, in which said insulation is configured to maintain said temperature of said photoluminescent material at a temperature equal to or greater than 600 Kelvin.

31. The method of claim 1 in which the temperature T is equal to or greater than 600 Kelvin.

* * * * *